United States Patent
Im

(10) Patent No.: US 12,389,766 B2
(45) Date of Patent: Aug. 12, 2025

(54) DISPLAY DEVICE, MANUFACTURING APPARATUS OF CHIP ON FILM, AND MANUFACTURING METHOD OF CHIP ON FILM

(71) Applicant: SAMSUNG DISPLAY CO., LTD., Yongin-si (KR)

(72) Inventor: Daehyuk Im, Daegu (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 826 days.

(21) Appl. No.: 17/602,069

(22) PCT Filed: Mar. 5, 2020

(86) PCT No.: PCT/KR2020/095013
§ 371 (c)(1),
(2) Date: Oct. 7, 2021

(87) PCT Pub. No.: WO2020/256533
PCT Pub. Date: Dec. 24, 2020

(65) Prior Publication Data
US 2022/0199751 A1 Jun. 23, 2022

(30) Foreign Application Priority Data
Jun. 19, 2019 (KR) ........................ 10-2019-0072584

(51) Int. Cl.
*H10K 59/131* (2023.01)
*H05K 1/14* (2006.01)
(Continued)

(52) U.S. Cl.
CPC ........... *H10K 59/131* (2023.02); *H05K 1/148* (2013.01); *G09G 2300/04* (2013.01);
(Continued)

(58) Field of Classification Search
CPC .. H10K 59/131; H10K 59/1201; H10K 59/00; H10K 71/00; H05K 2203/0228;
(Continued)

(56) References Cited

U.S. PATENT DOCUMENTS

| | | | |
|---|---|---|---|
| 5,951,304 | A | 9/1999 | Wildes et al. |
| 7,211,951 | B2 | 5/2007 | Choi et al. |

(Continued)

FOREIGN PATENT DOCUMENTS

| | | | |
|---|---|---|---|
| CN | 107342293 A | | 11/2017 |
| CN | 108241238 A | | 7/2018 |

(Continued)

OTHER PUBLICATIONS

"A study on Metallic Bonding Technology of COF and Panel Pad using Ultrasonic," The 8th Samsung Display Technology Symposium, Samsung Display Co., Ltd. internally announced on Sep. 14, 2018, 8 pages.

(Continued)

*Primary Examiner* — Adam R. Giesy
(74) *Attorney, Agent, or Firm* — CANTOR COLBURN LLP

(57) ABSTRACT

A display device includes a base film, a driving chip disposed under the base film, a first pad disposed under the base film and connected to the driving chip, and a display panel including a first connection pad connected to the first pad, where one side of the first pad has a first inclined surface which is angled at a first angle with respect to a top surface of the first pad, and the first angle is an acute angle.

16 Claims, 17 Drawing Sheets

(51) Int. Cl.
    *H10K 59/00*      (2023.01)
    *H10K 59/12*      (2023.01)
(52) U.S. Cl.
    CPC ............... *G09G 2300/0426* (2013.01); *H05K 2201/09154* (2013.01); *H10K 59/00* (2023.02); *H10K 59/1201* (2023.02)
(58) Field of Classification Search
    CPC ...... H05K 1/117; H05K 1/148; H05K 3/4007; H05K 2201/09154; H05K 3/0052; G09G 2300/04; G09G 2300/0426
    See application file for complete search history.

(56) References Cited

U.S. PATENT DOCUMENTS

| | | | |
|---|---|---|---|
| 8,011,989 | B2 | 9/2011 | Kim |
| 8,823,042 | B2 | 9/2014 | Kim |
| 10,038,044 | B2 | 7/2018 | Shin |
| 10,217,806 | B2 | 2/2019 | Kim et al. |
| 10,515,881 | B2 | 12/2019 | Kim et al. |
| 10,971,438 | B2 | 4/2021 | Song et al. |
| 11,016,350 | B2 | 5/2021 | Ahn et al. |
| 2013/0081268 | A1 | 4/2013 | Mok et al. |
| 2013/0134597 | A1 | 5/2013 | Kondo |
| 2015/0362769 | A1 | 12/2015 | Huang |
| 2017/0294621 | A1 | 10/2017 | Higano et al. |
| 2018/0063954 | A1 | 3/2018 | Kim et al. |
| 2018/0069067 | A1 | 3/2018 | Oh et al. |
| 2019/0058028 | A1 | 2/2019 | Won |
| 2019/0067406 | A1* | 2/2019 | Lee ..................... H10K 59/131 |
| 2020/0103943 | A1* | 4/2020 | Huang .................. H10K 59/87 |

FOREIGN PATENT DOCUMENTS

| | | | |
|---|---|---|---|
| CN | 109410759 | A | 3/2019 |
| JP | H11112119 | A | 4/1999 |
| JP | 2007214385 | A | 8/2007 |
| JP | 2014102440 | A | 6/2014 |
| JP | 2017187705 | A | 10/2017 |
| KR | 1020050001917 | A | 1/2005 |
| KR | 100512992 | B1 | 9/2005 |
| KR | 1020060092026 | A | 8/2006 |
| KR | 100689859 | B1 | 3/2007 |
| KR | 100793275 | B1 | 1/2008 |
| KR | 1020130036592 | A | 4/2013 |
| KR | 1020140000787 | A | 1/2014 |
| KR | 1020180000046 | A | 1/2018 |
| KR | 1020180062519 | A | 6/2018 |
| KR | 1020180070774 | A | 6/2018 |
| KR | 1020190018986 | A | 2/2019 |
| KR | 1020190052192 | A | 5/2019 |

OTHER PUBLICATIONS

Xiangdong Liu et al., "Low-pressure Cu—Cu bonding using in-situ surface-modified microscale Cu particles for power device packaging," Scripta Materialia, 2016, pp. 80-84, vol. 120, Elsevier Ltd.
Mingyu Li et al., "Rapid formation of Cu/Cu3Sn/Cu joints using ultrasonic bonding process at ambient temperature," Appl. Phys. Lett., 2013, 4 pages, vol. 102, 094104.
Myong-Hoon Roh et al., "A Review of Ag Paste Bonding for Automotive Power Device Packaging," J. Microelectron. Packag. Soc., 2015, pp. 15-23, vol. 22, English abstract.
Myong-Hoon Roh et al., "Trasient Liquid Phase bonding for Power Semiconductor," J. Microelectron. Packag. Soc., 2017, pp. 27-34, vol. 24, English abstract.
Sang Won Yoon et al., "Nickel-Tin Transient Liquid Phase Bonding Toward High-Temperature Operational Power Electronics in Electrified Vehicles," IEEE Transactions on Power Electronics, May 2013, pp. 2448-2456, vol. 28, No. 5.
Written Opinion for PCT/KR2020/095013 dated Jun. 12, 2020.
International Search Report mailed Jun. 12, 2020 for PCT/KR2020/095013.

* cited by examiner

DISPLAY DEVICE, MANUFACTURING APPARATUS OF CHIP ON FILM, AND MANUFACTURING METHOD OF CHIP ON FILM

TECHNICAL FIELD

Embodiments of the invention relate to a display device and apparatus and method for manufacturing a chip on film.

BACKGROUND ART

In general, a display device includes a display panel including a plurality of pixels and a driving chip for driving the pixels. The driving chip is typically disposed on a flexible film, and the flexible film is connected to a display panel. The driving chip is connected to the pixels of the display panel through the flexible film. This connection manner is referred to as a chip on film manner.

A plurality of pads connected to the driving chip are disposed on the flexible film, and the display panel includes a plurality of connection pads connected to pixels. The pads are respectively connected to contact the connection pads, and thus, the driving chip is connected to the pixels.

The pads and the connection pads are connected to each other in various manners. For example, the pads and the connection pads may be electrically connected to each other by an anisotropic conductive film ("ACF"). Alternatively, the pads and the connection pads may be connected to each other in an ultrasonic bonding manner without using the anisotropic conductive film.

DISCLOSURE OF THE INVENTION

Technical Problem

Embodiments of the invention provide a display device capable of preventing pads from being short-circuited, an apparatus for manufacturing a chip on film, and a method for manufacturing a chip on film.

Technical Solution

An embodiment of a display device according to the invention includes a base film, a driving chip disposed under the base film, a first pad disposed under the base film and connected to the driving chip, and a display panel including a first connection pad connected to the first pad. In such an embodiment, one side of the first pad has a first inclined surface which is angled at a first angle with respect to a top surface of the first pad, and the first angle is an acute angle.

In an embodiment, the one side of the first pad may be adjacent to one side of the base film connected to the display panel.

In an embodiment, the one side of the base film may have a second inclined surface which is angled at the first angle with respect to a top surface of the base film.

In an embodiment, the first inclined surface and the second inclined surface may be disposed on a same plane as each other.

In an embodiment, the first pad may extend in a first direction crossing an extension direction of the one side of the base film, and the first angle may be in a range of about 30 degrees to about 80 degrees with respect to the first direction.

In an embodiment, the first pad may be provided in plural, and the plurality of first pads may be arranged along the one side of the base film by extending in the first direction.

In an embodiment, the first pad may include a first portion on which the first inclined surface is defined and a second portion around the first portion.

In an embodiment, the first portion may be spaced apart from the first connection pad, and the second portion may be in contact with the first connection pad.

In an embodiment, the first portion has a length in the first direction less than or equal to ½ of a length of the first pad in the first direction.

An embodiment of an apparatus for manufacturing a chip on film according to the invention includes a first holder part on which a flexible circuit film is disposed on a top surface thereof and in which a first opening extending downward is defined, a second holder part disposed on the flexible circuit film to overlap the first holder part around the first opening and moveable vertically, and a punching part disposed on the flexible circuit film to overlap the first opening and movable vertically. In such an embodiment, the flexible circuit film includes a base film, a driving chip disposed under the base film, and a first pad disposed under the base film and connected to the driving chip. In such an embodiment, the first opening exposes a portion of the first pad and the driving chip, and each of a top surface of the first holder part, a bottom surface of the second holder part, and a bottom surface of the punching part has an inclined surface which is angled at a predetermined angle with respect to a first direction.

An embodiment of a method for manufacturing a chip on film according the invention includes disposing a flexible circuit film on a first holder part in which a first opening is defined, allowing a second holder part disposed on the flexible circuit film to overlap the first holder part around the first opening such that the second holder part moves downward to fix the flexible circuit film around the first opening, and inserting a punching part, which is disposed on the flexible circuit film to overlap the first opening, into the first opening such that the flexible circuit film is cut along an edge of the punching part. In such an embodiment, the flexible circuit film includes a base film, a driving chip disposed under the base film, and a first pad disposed under the base film and connected to the driving chip. In such an embodiment, the first opening exposes a portion of the first pad and the driving chip, and each of a top surface of the first holder part, a bottom surface of the second holder part, and a bottom surface of the punching part has an inclined surface which is angled at a predetermined angle with respect to a first direction.

An embodiment of a display device according to the invention includes a base film, a driving chip disposed under the base film, a first pad disposed under the base film and connected to the driving chip, and a display panel including a first connection pad which overlaps the first pad and is connected to the first pad when viewed on a plane. In such an embodiment, a portion of the first pad is spaced apart from an upper portion of the first connection pad.

Advantageous Effects

According to embodiments of the invention, in the chip on film, one side of each of the first pads may have the inclined surface, and thus, when the ultrasonic bonding is performed, the transmitted energy due to the ultrasonic vibration may be reduced to prevent the first pads to be short-circuited.

MODE FOR CARRYING OUT THE INVENTION

Figure 1:
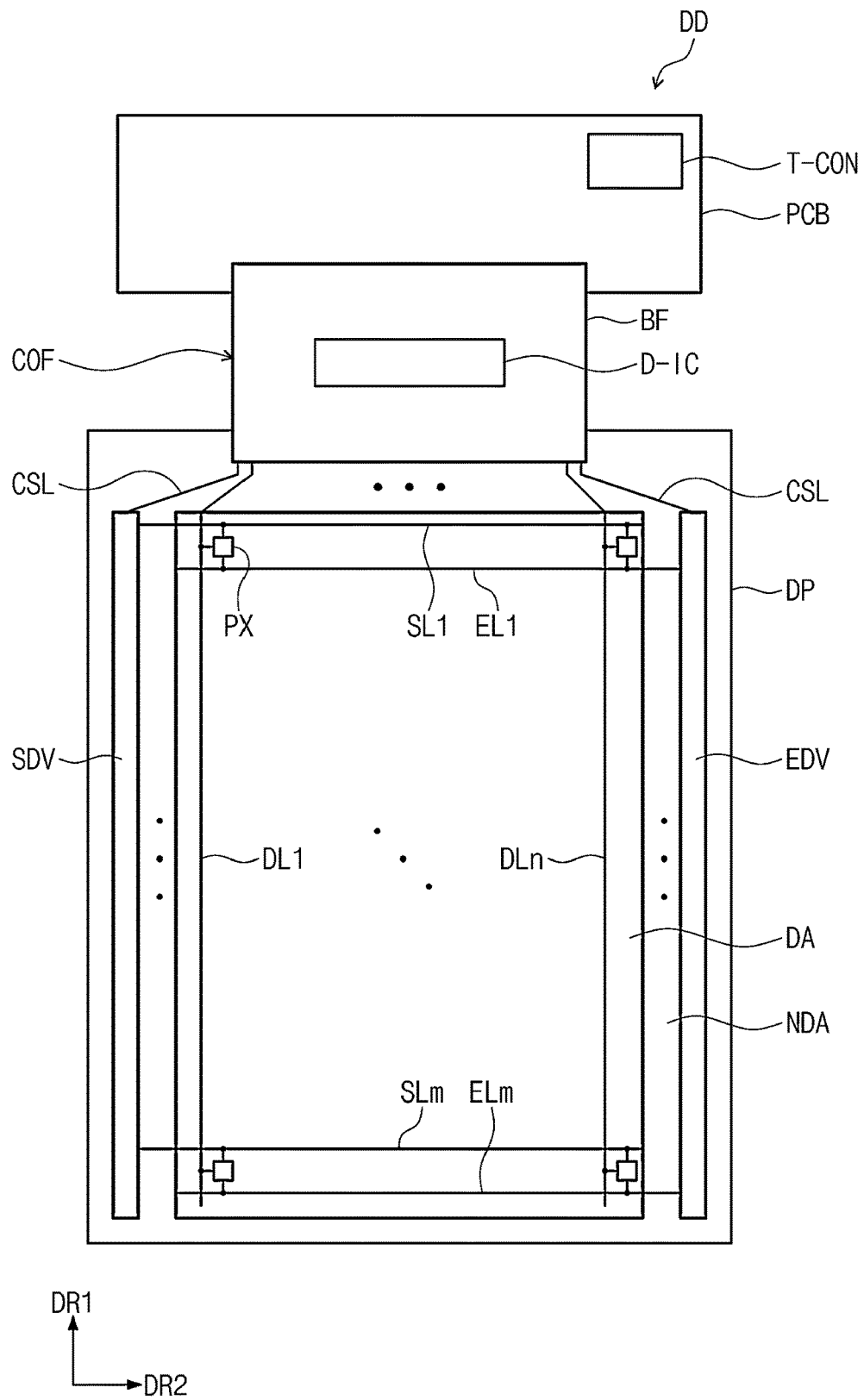
FIG. 1 is a plan view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or area, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a plan view of a display device according to an embodiment of the invention.

Referring to FIG. 1, an embodiment of a display device DD according to the invention may include a display panel DP, a scan driver SDV, a chip on film COF, an emission driver EDV, a printed circuit board PCB, and a timing controller T-CON.

In an embodiment of the invention, various image display panels capable of displaying an image, such as a liquid crystal display panel, an electrowetting display panel, an electrophoretic display panel, or a light emitting display panel may be used as the display panel DP.

In an embodiment, the display panel DP may be a light emitting display panel, but is not limited thereto. In one embodiment, for example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot, a quantum rod, and the like. Hereinafter, for convenience of description, embodiments where the display panel DP is the organic light emitting display panel will be described in detail.

In an embodiment, the display panel DP may be a flexible display panel. In one embodiment, for example, the display panel DP may include a plurality of electronic elements disposed on a flexible substrate. The display panel 110 may have a rectangular shape having long sides in the first direction DR1 and short sides in the second direction DR2 crossing the first direction DR1.

The display panel DP may include a surface on a plane defined by the first and second directions DR1 and DR2. The display panel DP may include a display area DA and a non-display area NDA surrounding the display area DA.

The display panel DP may include a plurality of pixels PX, a plurality of scan lines SL1 to SLm, a plurality of data lines DL1 to DLn, and a plurality of emission lines EL1 to ELm. Here, m and n are natural numbers. The pixels PX may be arranged in a matrix form, but is not limited thereto and thus may be arranged in various forms. The pixels PX may be disposed on the display area DA and connected to the scan lines SL1 to SLm, the data lines DL1 to DLn, and the emission lines EL1 to ELm.

A scan driver SDV and an emission driver EDV may be disposed on the non-display area NDA. The scan driver SDV may be disposed on the non-display area NDA adjacent to one long side of the long sides of the display panel DP. The emission driver EDV may be disposed on the non-display area NDA adjacent to the other long side of the long sides of the display panel DP. The scan driver SDV and the emission driver EDV may be disposed opposite to each other with the display area DA therebetween.

The scan lines SL1 to SLm may extend in the second direction DR2 and be connected to the scan driver SDV. The emission lines EL1 to ELm may extend in the second direction DR2 and be connected to a gate driver EDV.

The chip on film COF may include a base film BF and a driving chip D-IC disposed on the base film BF. The driving chip D-IC may be defined as a data driver. The driving chip D-IC may be manufactured in the form of an integrated circuit chip and mounted on the base film BF.

Hereinafter, one side of both opposing sides of the base film BF, which are opposite to each other in the first direction DR1 (e.g., an upper side and a lower side), is defined as one side of the base film BF, and the other side of the of both opposing sides is defined as the other side of the base film BF.

The base film BF may have a rectangular shape with short sides in the first direction DR1 and long sides in the second direction DR2. One side of the base film BF may be connected to the non-display area NDA adjacent to one of the short sides of the display panel DP. The other side of the base film BF may be connected to the printed circuit board PCB.

Although not shown, a plurality of lines connected to the driving chip D-IC may be disposed on the base film BF. The lines disposed on the base film BF will be described in detail below with reference to FIG. 4. The data lines DL1 to DLn may extend in the first direction DR1 and be connected to the lines disposed on the base film BF. Thus, the data lines DL1 to DLn may be connected to the driving chip D-IC through the lines disposed the base film BF.

The scan driver SDV may generate a plurality of scan signals, and the scan signals may be applied to the pixels PX through the scan lines SL1 to SLm. The scan signals may be sequentially applied to the pixel PX.

The driving chip D-IC may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

A timing controller T-CON may be disposed on the printed circuit board PCB. The timing controller T-CON may be manufactured in the form of an integrated circuit chip and mounted on the printed circuit board PCB. Although not shown, various circuits such as a power generation circuit and an interface circuit may be disposed on the printed circuit board PCB in addition to the timing controller T-CON.

The timing controller T-CON may control operations of the scan driver SDV, the driver chip D-IC, and the light emitting driver EDV. In one embodiment, for example, the timing controller T-CON may generate a scan control signal, a data control signal, and an emission control signal in response to control signals received from the outside. The timing controller T-CON may receive image signals from the outside and convert the data format of the image signals to meet the interface specification with the driver chip D-IC, thereby providing the converted data format to the driver chip D-IC.

The scan control signal and the emission control signal may be respectively provided to the scan driver SDV and the emission driver EDV through the driving chip D-IC. The scan control signal and the emission control signal may be respectively provided to the scan driver SDV and the emission driver EDV through control signal lines CSL. The control signal lines CSL may be connected to lines disposed on the base film BF. The data control signal may be provided to the driving chip D-IC.

The scan driver SDV may generate scan signals in response to the scan control signal, and the emission driver EDV may generate emission signals in response to the emission control signal. The driving chip D-IC may receive image signals in which the data format is converted and generate data voltages corresponding to the image signals in response to the data control signal.

The pixels PX may receive the data voltages in response to the scan signals. The pixels PX may emit light having luminance corresponding the data voltages in response to the emission signals to display an image. An emission time of the pixels PX may be controlled by the emission signals.

Figure 2:
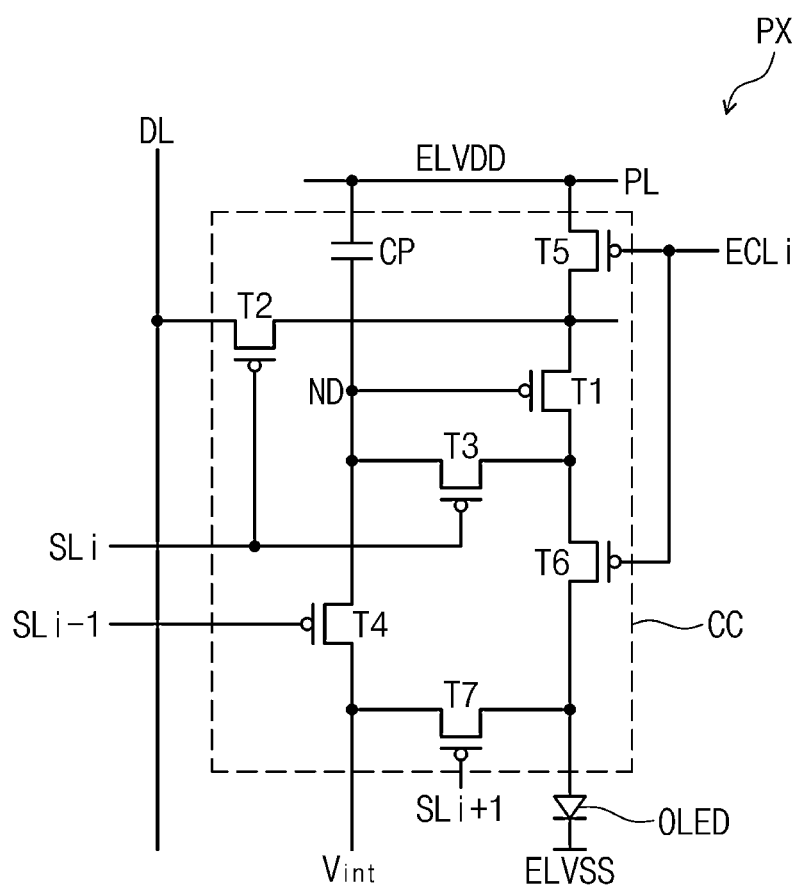
FIG. 2 is an equivalent circuit view of one pixel of FIG. 1.

FIG. 2 is an equivalent circuit view of one pixel of FIG. 1.

In FIG. 2, an equivalent circuit diagram of an embodiment of one pixel PX is illustrated, but other pixels PX illustrated in FIG. 1 may also have a same equivalent circuit diagram as the pixel PX illustrated in FIG. 2.

Referring to FIG. 2, an embodiment of the pixel PX may be connected to a corresponding scan line SLi of the scan lines SL1 to SLm, a corresponding data line DLj of the data lines DL1 to DLn, and a corresponding emission line ELi of the emission lines EL1 to ELm. Here, i is a natural number less than or equal to m, and j is a natural number less than or equal to n.

The pixel PX may include a pixel circuit CC and a light emitting element OLED. In an embodiment, the pixel circuit CC may include a first transistor (hereinafter, will be referred to as "driving transistor") T1, a capacitive element CP, a second transistor (hereinafter, will be referred to as "switching transistor") T2, and a third transistor (hereinafter, will be referred to as "emission control transistor") T3. The light emitting element OLED may be defined as an organic light emitting diode.

A source terminal of the driving transistor T1 may receive a first voltage ELVDD through a power line PL, and a drain terminal of the driving transistor T1 may be connected to the source terminal of the emission control transistor T3. A gate terminal of the driving transistor T1 may be connected to a drain terminal of the switching transistor T2.

A gate terminal of the switching transistor T2 may be connected to the scan line SLi, and a source terminal of the switching transistor T2 may be connected to the data line DLj. A first electrode of the capacitive element CP may be connected to the source terminal of the driving transistor T1, and a second electrode of the capacitive element CP may be connected to the gate terminal of the driving transistor T1.

A gate terminal of the emission control transistor T3 may be connected to the emission line ELi, and a drain terminal of the emission control transistor T3 may be connected to an anode electrode of the light emitting element OLED. A cathode electrode of the light emitting element OLED may receive a second voltage ELVSS, and the second voltage ELVSS may have a level lower than that of the first voltage ELVDD.

The switching transistor T2 may be turned on in response to the scan signal SCAN provided through the scan line SLi. The turned-on switching transistor T2 may provide a data voltage DATA provided through the data line DLj to the gate terminal of the driving transistor T1.

The capacitive element CP may charge the data voltage DATA applied to the gate terminal of the driving transistor T1 to be maintained even after the switching transistor T2 is turned off.

The emission control transistor T3 may be turned on in response to an emission signal EM applied to the gate terminal through the emission line ELi. The turned-on emission control transistor T3 may serve to provide current flowing through the driving transistor T1 to the light emitting element OLED. The pixel PX may emit light during an applying time of the emission signal EM. The light emitting element OLED may emit light by varying an intensity according to an amount of supplied current Ioled.

In one embodiment, for example, the transistors T1 to T3 of the pixel PX may be PMOS transistors, but are not limited thereto, and the transistors T1 to T3 of the pixel PX may be NMOS transistors.

In an embodiment, the pixel circuit CC may further include additional elements such as a fourth transistor T4 connected to a previous scan line SLi-1 and between an initial voltage Vint and a node, which is connected to the driving transistor T1 and the capacitive element CP, a fifth transistor connected to an emission line ECLi and between the driving transistor T1 and the power line OL, a sixth transistor T6 connected to the emission line ECLi and between the driving transistor T1 and the light emitting element OLED, and a seventh transistor T7 connected to a next scan line SLi+1 and between the fourth transistor T4 and the light emitting element OLED, as shown in FIG. 2.

Figure 3:
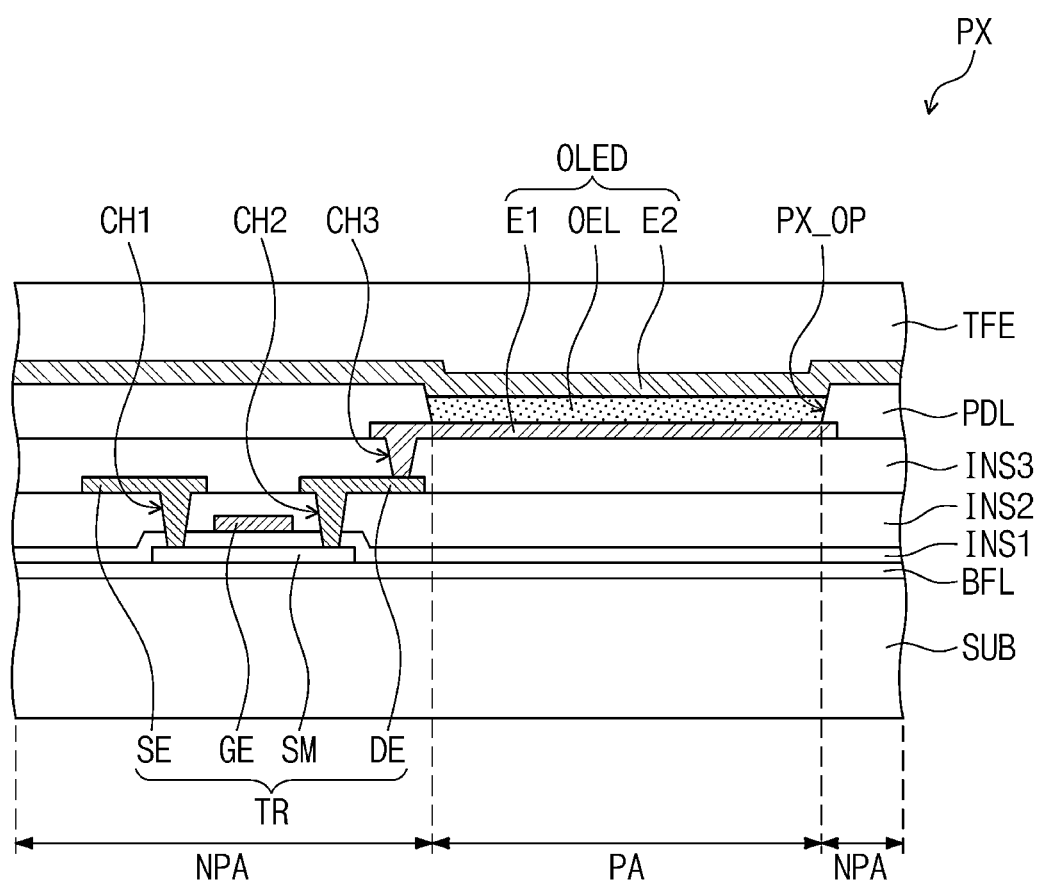
FIG. 3 is a schematic cross-sectional view of a pixel illustrated in FIG. 2.

FIG. 3 is a schematic cross-sectional view of the pixel illustrated in FIG. 2.

Referring to FIG. 3, an embodiment of the pixel PX may include the light emitting element OLED and the transistor TR connected to the light emitting element OLED. The light emitting element OLED may include a first electrode E1, a second electrode E2, and an organic emission layer OEL disposed between the first electrode E1 and the second electrode E2. The transistor TR shown in FIG. 3 may be the sixth transistor T6 illustrated in FIG. 2.

The first electrode E1 may be an anode electrode, and the second electrode E2 may be a cathode electrode. The first electrode E1 may be defined as a pixel electrode, and the second electrode E2 may be defined as a common electrode.

The pixel PX may be divided into a pixel area PA and a non-pixel area NPA around the pixel area PA. The light emitting element OLED may be disposed on the pixel area PA, and the transistor TR may be disposed on the non-pixel area NPA.

The transistor TR and the light emitting element OLED may be disposed on the substrate SUB. A buffer layer BFL may be disposed on the substrate SUB, and the buffer layer may include an inorganic material.

The semiconductor layer SM of the transistor TR may be disposed on the buffer layer BFL. The semiconductor layer SM may include a semiconductor including or made of an inorganic material such as amorphous silicon or polycrystalline silicon, or an organic semiconductor. Also, the semiconductor layer SM may include an oxide semiconductor. Although not shown in FIG. 3, the semiconductor layer SM may include a source region, a drain region, and a channel region between the source region and the drain region.

A first insulation layer INS1 may be disposed on the buffer layer BFL to cover the semiconductor layer SM. The first insulation layer INS1 may include an inorganic material. A gate electrode GE of the transistor TR overlapping the semiconductor layer SM may be disposed on the first insulation layer INS1. The gate electrode GE may be disposed to overlap the channel region of the semiconductor layer SM.

A second insulation layer INS2 may be disposed on the first insulation layer INS1 to cover the gate electrode GE. The second insulation layer INS2 may be defined as an interlayer dielectric. The second insulation layer INS2 may include an organic material and/or an inorganic material.

The source electrode SE and the drain electrode DE of the transistor TR may be disposed to be spaced apart from each other on the second insulation layer INS2. The source electrode SE may be connected to the source region of the semiconductor layer SM through a first contact hole CH1 that is defined through the first and second insulation layers INS1 and INS2. The drain electrode DE may be connected to the drain region of the semiconductor layer SM through a second contact hole CH2 that is defined through the first and second insulation layers INS1 and INS2.

A third insulation layer INS3 may be disposed on the second insulation layer INS2 to cover the source and drain electrodes SE and DE of the transistor TR. The third insulation layer INS3 may be defined as a planarization layer that provides a flat top surface and include an organic material.

The first electrode E1 may be disposed on the third insulation layer INS3. The first electrode E1 may be connected to the drain electrode DE of the transistor TR through a third contact hole CH3 that is defined through the third insulation layer INS3.

A pixel define layer PDL through which a predetermined area of the first electrode E1 is exposed may be disposed on the first electrode E1 and the third insulation layer INS3. An opening PX_OP through which a predetermined portion of the first electrode E1 is exposed may be defined in the pixel define layer PDL.

An organic emission layer OEL may be disposed on the first electrode E1 within the opening PX_OP. The organic emission layer OEL may emit one of red light, green light, and blue light. However, the embodiment of the invention is not limited thereto. In one embodiment, for example, the organic emission layer OEL may generate white light by combination of organic materials that respectively generate red, green, and blue light.

The second electrode may be disposed on the pixel define layer PDL and the organic light emitting layer OEL. The thin film encapsulation layer TFE may be disposed on the light emitting element OLED to cover the pixel PX.

The first voltage ELVDD may be applied to the first electrode E1, and the second voltage ELVSS may be applied to the second electrode E2. Holes and electrons injected into the organic emission layer OEL may be coupled to each other to form exciton. While the exciton may be transitioned to a ground state, the organic light emitting element OLED may emit light. The light emitting element OLED may emit red, green, or blue light based on a flow of current to display an image.

Figure 4:
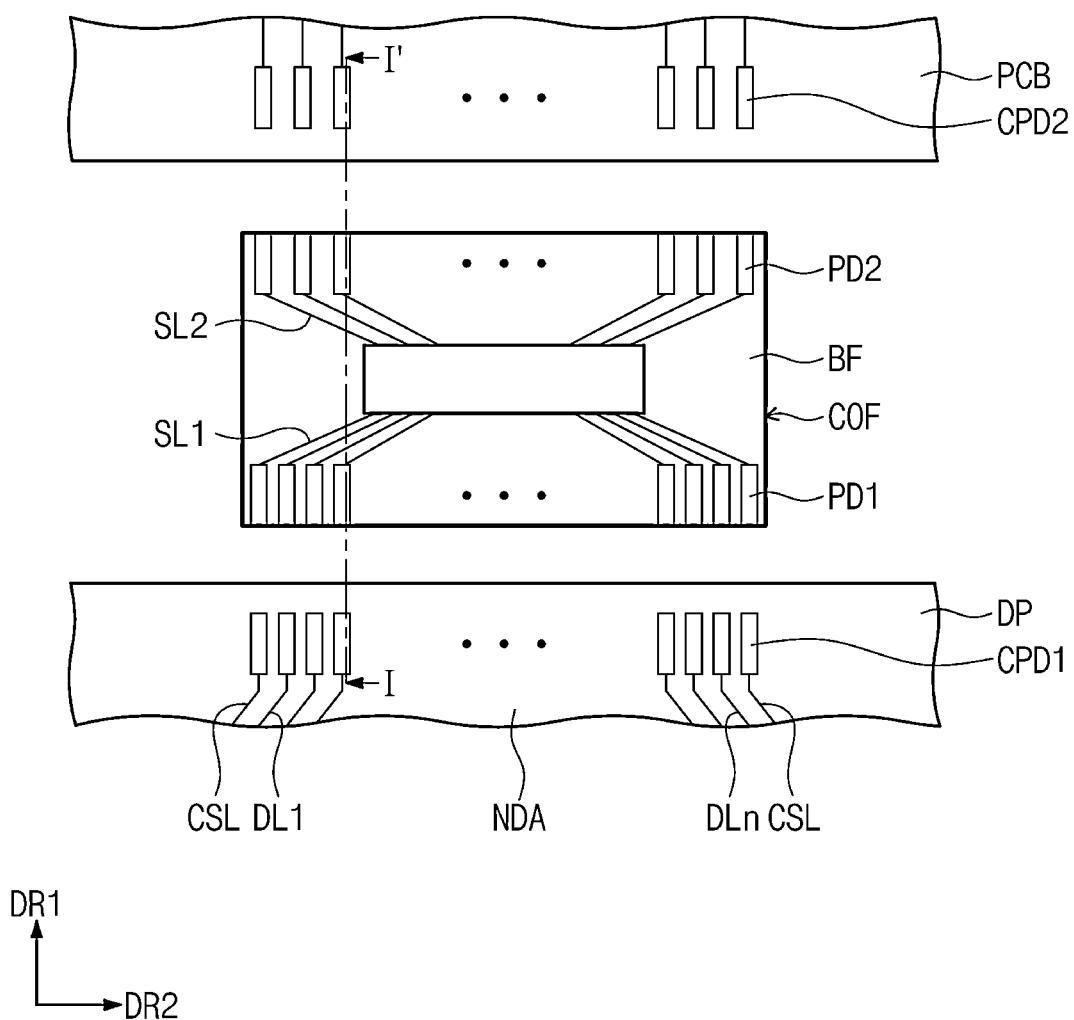
FIG. 4 is an enlarged view of a chip on film illustrating a detailed configuration of the chip on film of FIG. 1.

FIG. 4 is an enlarged view of a chip on film illustrating a detailed configuration of the chip on film of FIG. 1.

For convenience of description, a portion of a display panel DP connected to a chip on film COF and a portion of a printed circuit board PCB connected to the chip on film COF may be separated from the chip on film COF and separately illustrated in FIG. 4.

Referring to FIG. 4, the chip on film COF may include a plurality of first pads PD1, a plurality of second pads PD2, a plurality of first signal lines SL1, and a plurality of second signal lines SL2. The first and second pads PD1 and PD2 and the first and second signal lines SL1 and SL2 may be disposed on the base film BF.

The first pads PD1 may be disposed adjacent to one side of the base film BF. The first pads PD1 may extend in the first direction DR1 and may be arranged in the second direction DR2. Each of the first pads PD1 may have a rectangular shape having long sides in the first direction DR1 and short sides in the second direction DR2. One side of the base film BF may extend in parallel to the second direction DR2. The first pads PD1 may be arranged along one side of the base film BF.

The second pads PD2 may be disposed adjacent to the other side of the base film BF. The second pads PD2 may extend in the first direction DR1 and may be arranged in the second direction DR2. Each of the second pads PD2 may have a rectangular shape having long sides in the first direction DR1 and short sides in the second direction DR2. The other side of the base film BF may extend in parallel to the second direction DR2. The second pads PD2 may be arranged along the other side of the base film BF.

A distance between the first pads PD1 adjacent to each other may be less than that between the second pads PD2 adjacent to each other. The number of the first pads PD1 disposed on the base film BF may be greater than the number of the second pads PD2.

The driving chip D-IC may be disposed between the first pads PD1 and the second pads PD2. The driving chip D-IC may have a rectangular shape having long sides in the second direction DR2 and short sides in the first direction DR1.

The first pads PD1 and the second pads PD2 may be connected to the driving chip D-IC by the first and second signal lines SL1 and SL2. In one embodiment, for example, the first signal lines SL1 may be disposed between the first pads PD1 and the driving chip D-IC to be connected to the first pads PD1 and the driving chip D-IC. The second signal lines SL2 may be disposed between the second pads PD2 and the driving chip D-IC to be connected to the second pads PD2 and the driving chip D-IC.

A plurality of first connection pads CPD1 may be disposed on the display panel DP. The first connection pads CPD1 may extend in the first direction DR1 and be arranged in the second direction DR2. Each of the first connection pads CPD1 may have a rectangular shape having long sides in the first direction DR1 and short sides in the second direction DR2.

The first connection pads CPD1 may be disposed on the non-display area NDA adjacent to one short side of the display panel DP. The control signal lines CSL and the data lines DL1 to DLn may be connected to the first connection pads CPD1.

The number of the first connection pads CPD1 may be the same as the number of the first pads PD1. The first connection pads CPD1 may be connected to the first pads PD1, respectively. Since the first connection pads CPD1 are connected to the first pads PD1, one side of the base film BF may be connected to the display panel DP, and the control signal lines CSL and the data lines DL1 to DLn may be connected to the driving chip D-IC through the first signal lines SL1.

A plurality of second connection pads CPD2 may be disposed on the printed circuit board PCB. The second connection pads CPD2 may extend in the first direction DR1 and be arranged in the second direction DR2. Each of the second connection pads CPD2 may have a rectangular shape having long sides in the first direction DR1 and short sides in the second direction DR2.

The second connection pads CPD2 may be adjacent to one side of the printed circuit board PCB. The second connection pads CPD2 may be connected to third signal lines SL3. Although not shown, the third signal lines SL3 may be connected to the timing controller T-CON.

The number of the second connection pads CPD2 may be the same as the number of the second pads PD2. The second connection pads CPD2 may be respectively connected to the second pads PD2. Since the second connection pads CPD2 are connected to the second pads PD2, the other side of the base film BF may be connected to the printed circuit board PCB, and the timing controller T-CON may be connected to the driving chip D-IC.

Figure 5:
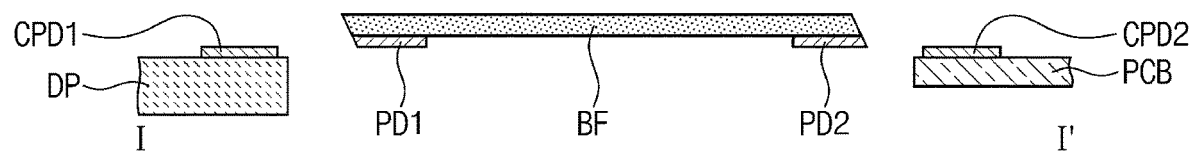
FIG. 5 is a cross-sectional view taken along line I-I' of FIG. 4.
Figure 5:
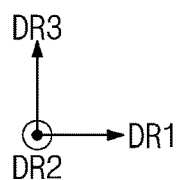
Figure 6:
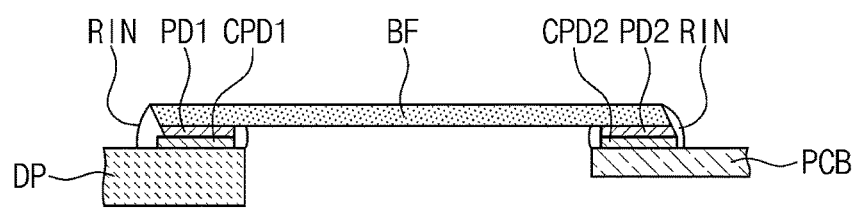
FIG. 6 is a view illustrating a connection state between first and second pads and first and second connection pads, which are illustrated in FIG. 5.
Figure 6:
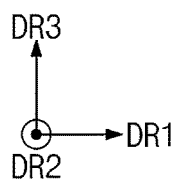

FIG. 5 is a cross-sectional view taken along line I-I' of FIG. 4. FIG. 6 is a view illustrating a connection state between the first and second pads and the first and second connection pads, which are illustrated in FIG. 5.

More particularly, FIG. 6 illustrates a cross-sectional view corresponding to FIG. 5. In addition, for convenience of description, cross-sections of the first and second signal lines SL1 and SL2 are omitted in FIGS. 5 and 6.

Referring to FIG. 5, the first pad PD1 and the second pad PD2 may be disposed under the base film BF. Although not shown, the driving chip D-IC and the first and second signal lines SL1 and SL2 may also be disposed under the base film BF. The driving chip D-IC may be mounted on a bottom surface of the base film BF. The first and second pads PD1 and PD2 and the first and second signal lines SL1 and SL2 may be formed by patterning a predetermined conductive material provided on the bottom surface of the base film BF.

Hereinafter, a direction crossing a plane defined by the first and second directions DR1 and DR2 is defined as a third direction DR3. Substantially, the third direction DR3 may perpendicularly cross the plane defined by the first and second directions DR1 and DR2. Here, the term "when viewed on the plane" may mean when viewed in the third direction D3.

Each of one side of the first pad PD1 and one side of the base film BF may have an inclined surface. The one side of the first pad PD1 may be defined as a portion of the first pad PD1 adjacent to the one side of the base film BF. Each of one side of the second pad PD2 and the other side of the base film BF may have an inclined surface. The one side of the second pad PD2 may be defined as a portion of the second pad PD2 adjacent to the other side of the base film BF. The inclined surfaces of the first and second pads PD1 and PD2 will be described in detail below with reference to FIG. 7.

Referring to FIG. 6, the first pad PD1 may be disposed on the first connection pad CPD1 and may overlap the first connection pad CPD1 when viewed on the plane. The second pad PD2 may be disposed on the second connection pad CPD2 and may overlap the second connection pad CPD2 when viewed on the plane.

The first pad PD1 may be in contact with the first connection pad CPD1 and may be connected to the first connection pad CPD1. A portion of the first pad PD1 adjacent to one side of the base film BF may be spaced upward from the first connection pad CPD1 not to be in contact with the first connection pad CPD1. The second pad PD2 may be in contact with the second connection pad CPD2 and may be connected to the second connection pad CPD2.

A resin RIN may be provided or disposed on each of both sides of the first pad PD1 and each of both sides of the first connection pad CPD1. Also, the resin RIN may be disposed on each of both sides of the second pad PD2 and each of both sides of the second connection pad CPD2.

The resin RIN may be disposed to cover both the sides of the first pad PD1 and both the sides of the first connection pad CPD1, thereby protecting the first pad PD1 and the first connection pad CPD1. Also, the resin RIN may be disposed to cover both the sides of the second pad PD2 and both the sides of the second connection pad CPD2, thereby protecting the second pad PD2 and the second connection pad CPD2.

Figure 7:
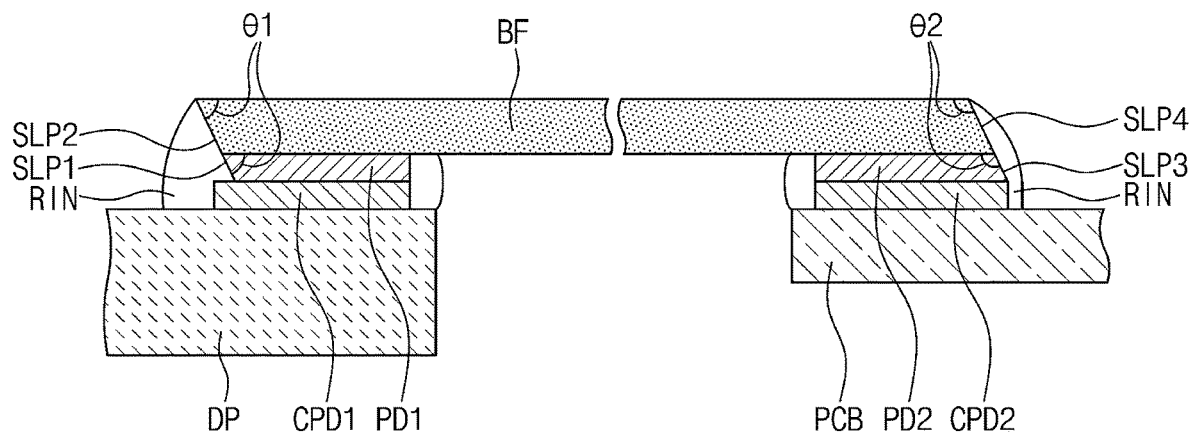
FIG. 7 is an enlarged view illustrating the first and second pads and the first and second connection pads, which are illustrated in FIG. 5.
Figure 7:
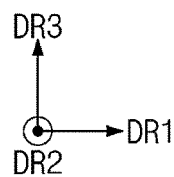
Figure 8:
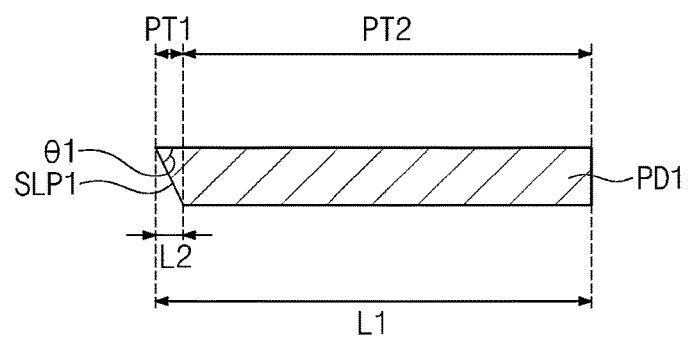
FIG. 8 is an enlarged view of the first pad illustrated in FIG. 7.
Figure 8:
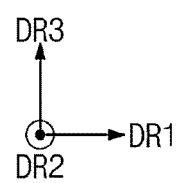

FIG. 7 is an enlarged view illustrating the first and second pads and the first and second connection pads, which are illustrated in FIG. 5. FIG. 8 is an enlarged view of the first pad illustrated in FIG. 7.

Referring to FIG. 7, one side of the first pad PD1 may have a first inclined surface SLP1 that is angled at a first angle $\theta 1$ with respect to a top surface of the first pad PD1. The top surface of the first pad PD1 may be substantially on a plane defined by the first and second directions DR1 and DR2. The top surface of the first pad PD1 may be defined as one surface of the first pad PD1 facing the base film BF. The first inclined surface SLP1 may be an inclined surface that is angled at the first angle $\theta 1$ with respect to the first direction DR1.

The first angle $\theta 1$ may be an acute angle. The acute angle may be defined as an angle less than 90 degrees. Thus, the first inclined surface SLP1 may be defined as an inclined surface extending at an angle greater than 0 degrees and less than 90 degrees with respect to the first direction DR1. In an embodiment of the invention, the first angle $\theta 1$ may be in a range of about 30 degrees to about 80 degrees based on the first direction DR1.

One side of the base film BF may have a second inclined surface SLP2 that is angled at the first angle $\theta 1$ with respect to a top surface of the base film BF. The top surface of the base film BF may be substantially on a plane defined by the first and second directions DR1 and DR2. The second inclined surface SLP2 may be an inclined surface that is angled at the first angle $\theta 1$ with respect to the first direction DR1.

The top surface of the base film BF may be defined as one surface of the base film BF, which is opposite to a bottom surface of the base film BF, which faces the first pad PD1. The first inclined surface SLP1 and the second inclined surface SLP2 may be disposed on a same plane as each other.

One side of the second pad PD2 may have a third inclined surface SLP3 that is angled at a second angle $\theta 2$ with respect to a top surface of the second pad PD2. The top surface of the second pad PD2 may be substantially on a plane defined by the first and second directions DR1 and DR2. The third inclined surface SLP3 may be an inclined surface that is angled at the second angle $\theta 2$ with respect to the first direction DR1.

The second angle $\theta 2$ may be an obtuse angle. The obtuse angle may be defined as an angle greater than 90 degrees. Thus, the third inclined surface SLP3 may be defined as an inclined surface extending at an angle greater than 90 degrees and less than 180 degrees with respect to the first direction DR1.

In an embodiment, the second angle $\theta 2$ based on the first direction DR1 may be defined as a value obtained by subtracting the first angle $\theta 1$ from 180 degrees. That is, the third inclined surface SLP3 may have a reverse inclined surface with respect to the first inclined surface SLP1. In such an embodiment, the third inclined surface SLP3 may be substantially parallel with the first inclined surface SLP1. In an embodiment of the invention, the second angle $\theta 2$ may be in a range of about 100 degrees to about 150 degrees based on the first direction DR1.

The other side of the base film BF may have a fourth inclined surface SLP4 that is angled at the second angle $\theta 2$ with respect to the top surface of the base film BF. The fourth inclined surface SLP4 may be an inclined surface that is angled at the second angle $\theta 2$ with respect to the first direction DR1. The third inclined surface SLP3 and the fourth inclined surface SLP4 may be disposed on a same plane as each other.

According to an embodiment of a method for manufacturing a chip on film COF, the first inclined surface SLP1 and the second inclined surface SLP2 may have a same inclined surface as each other, and the third inclined surface SLP3 and the fourth inclined surface SLP4 may have a same inclined surface as each other. The method for manufacturing the chip on film COF will be described in detail below with reference to FIGS. 15 to 20.

Referring to FIGS. 7 and 8, the first pad PD1 may include a first portion PT1, on which an inclined surface is defined, and a second portion PT2 around the first portion PT1. The first portion PT1 may be spaced upward from the first connection pad CPD1 so as not to be in contact with the first connection pad CPD1. The second portion PT2 may be in contact with the first connection pad CPD1 and may be connected to the first connection pad CPD1.

In an embodiment, the first pad PD1 may have a first length L1 in the first direction DR1, and the first portion PT1 may have a second length L2 in the first direction DR1. The second length L2 may be less than or equal to ½ of the first length L1.

Figure 9:
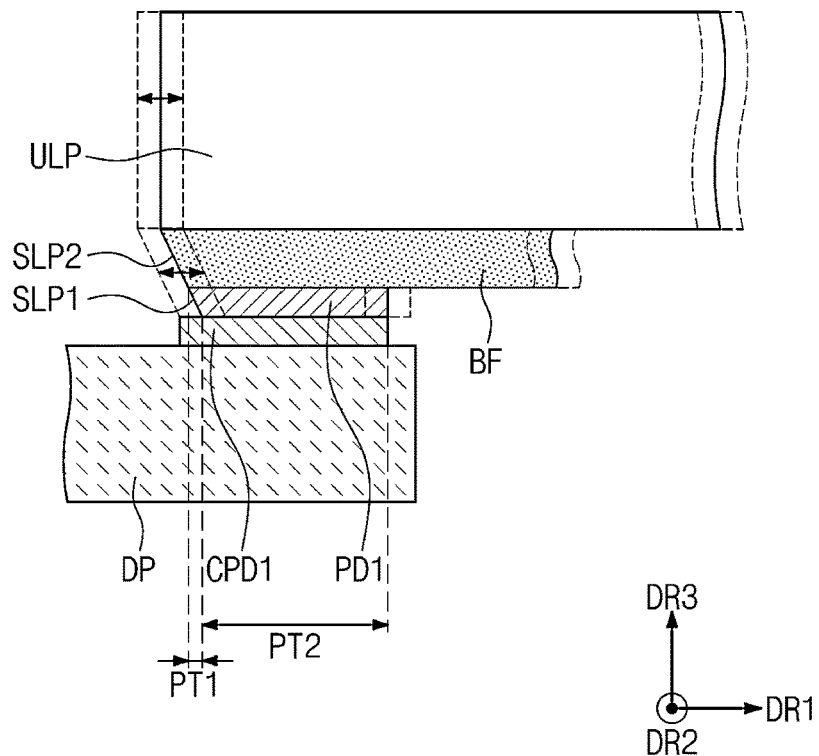
FIG. 9 is a view for explaining a method for connecting the first pad to the first connection pad.
Figure 10:
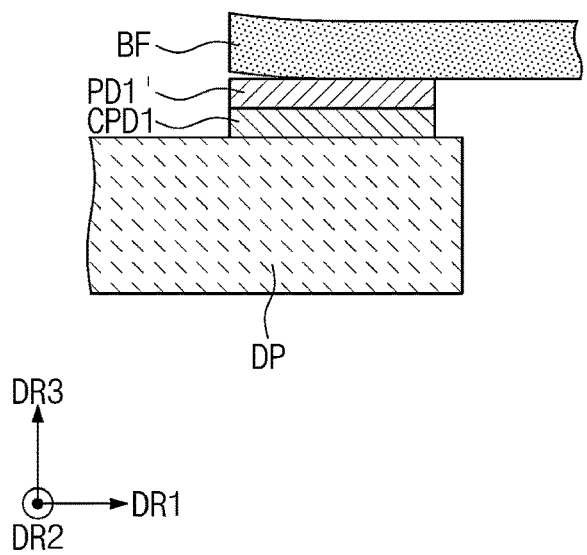
FIG. 10 is a view for explaining a connection between a comparison pad and the first connection pad according to an embodiment of the invention.

FIG. 9 is a view for explaining a method for connecting the first pad to the first connection pad. FIG. 10 is a view for explaining a connection between a comparison pad and the first connection pad according to an embodiment of the invention.

Referring to FIG. 9, in an embodiment, a bottom surface of the first pad PD1 may be in contact with a top surface of the first connection pad CPD1, and an ultrasonic vibration part ULP may be connected to the base film BF. In such an embodiment, the second portion PT2 of the first pad PD1 may be in contact with a top surface of the first connection pad CPD1. The ultrasonic vibration part ULP may be defined as a horn.

The ultrasonic vibration part ULP may generate vibration having a predetermined frequency. In one embodiment, for example, the ultrasonic vibration part ULP may generate ultrasonic vibration, which is vibrated at a frequency of 35 kilohertz (KHz) in the first direction DR1. The ultrasonic vibration may be applied to the first pad PD1 through the base film BF.

The first pad PD1 may be vibrated in the first direction DR1 by the ultrasonic vibration, and energy due to the ultrasonic vibration may be transferred to a contact surface between the first pad PD1 and the first connection pad CPD1. The principle of the ultrasonic vibration is as follows.

When a solid is subjected to external force, deformation may occur in the solid. In a case in which the external force is less, when the external force is removed, the solid may be restored to its original shape. However, when the external force reaches a specific threshold, the solid may not be restored to its original shape, and thus, permanent deformation may occur in the solid. This deformation may be defined as plastic deformation.

As the external force increases, stress in the solid may also gradually increase. However, when the external force reaches a critical value, the permanent deformation may increase rapidly. A limiting value of this stress (the aforementioned threshold value) may be defined as a yield value (yield point).

The energy due to the ultrasonic vibration may be transferred to the contact surface (or contact interface) between the first pad PD1 and the first connection pad CPD1. Each of the first pad PD1 and the first connection pad CPD1 may include a solid metal. The energy due to the ultrasonic vibration may be defined as an external force.

Since the energy due to the ultrasonic vibration is transferred to the first pad PD1 and the first connection pad CPD1, the stress of the first pad PD1 and the first connection pad CPD1 may increase. When the stress reaches the yield value, plastic deformation may occur in the first pad PD1 and the first connection pad CPD1. Also, an oxide layer on the contact surface (metal surface) of each of the first pad PD1 and the first connection pad CPD1 may be removed so that the first pad PD1 and the first connection pad CPD1 are in direct contact with each other.

Heat may be generated to increase in temperature due to continuous friction and plastic deformation between the first pad PD1 and the first connection pad CPD1. In this case, atoms of the first pad PD1 and the first connection pad CPD1 may be diffused with each other on the contact surface between the first pad PD1 and the first connection pad CPD1, which are in direct contact with each other.

In one embodiment, for example, the atoms of the contact surface of the first pad PD1 may be diffused toward the first connection pad CPD1, and the atoms of the contact surface of the first connection pad CPD1 may be diffused toward the first pad PD1. As a result, the first pad PD1 and the first connection pad CPD1 may be directly coupled to each other.

Since the first portion PT1 of the first pad PD1 is not in contact with the first connection pad CPD1, the ultrasonic bonding manner may not be applied. The second portion PT2 of the first pad PD1 may be in contact with the first connection pad CPD1 and may be directly connected to the first connection pad CPD1 by the ultrasonic bonding.

Referring to FIG. 10, unlike the first pad PD1 illustrated in FIG. 9, when viewed in the second direction DR2, a conventional pad, e.g., a comparison pad PD1' shown in FIG. 10, may not have an inclined surface and may have a rectangular shape. The comparison pad PD1' may be connected to the first connection pad CPD1 by the ultrasonic bonding manner.

When the comparison pad PD1' has the rectangular shape, a contact area of the comparison pad PD1' that is in contact with the first connection pad CPD1, may be greater than that of the first pad PD1 that is in contact with the first connection pad CPD1. Energy transferred to the comparison pad PD1' may be proportional to the contact area.

Strong energy due to the ultrasonic vibration may be applied to the comparison pad PD1' having a wide contact area. In this case, when the comparison pad PD1' is vibrated in the first direction DR1, one side of the base film BF and one side of the comparison pad PD1' may be peeled off with respect to each other.

When the comparison pad PD1' is peeled from the base film BF, a portion of the peeled comparison pad PD1' may be bent in the second direction DR2 by the ultrasonic energy, and the bent comparison pad PD1' may be in contact with other adjacent comparison pads. That is, a short-circuit phenomenon in which the comparison pads are short-circuited with each other may occur.

Referring to FIG. 9, in an embodiment of the invention, the contact area of the first pad PD1 that is in contact with the first connection pad CPD1 may be less than that of the comparison pad PD1' that is in contact with the first connection pad CPD1. Thus, energy applied to the first pad PD1 due to the ultrasonic vibration may be less than that applied to the comparison pad PD1' due to the ultrasonic vibration. In this case, a problem in which the first pad PD1 is peeled off from the base film BF or is bent in the second direction DR2 may not occur. Thus, the first pads PD1 may not be short-circuited with each other.

According to an embodiment of the invention, since one side of the first pads PD1 of the chip on film COF has the first inclined surface SLP1, when the ultrasonic bonding is performed, the transmitted energy due to the ultrasonic vibration may be reduced to prevent the first pads PD1 from being short-circuited with each other.

The short-circuit phenomenon may occur between the pads having a narrow distance therebetween and may not occur between the pads having a wide distance therebetween. That is, the short-circuit phenomenon may not substantially occur in the second pads PD2.

Figure 11:
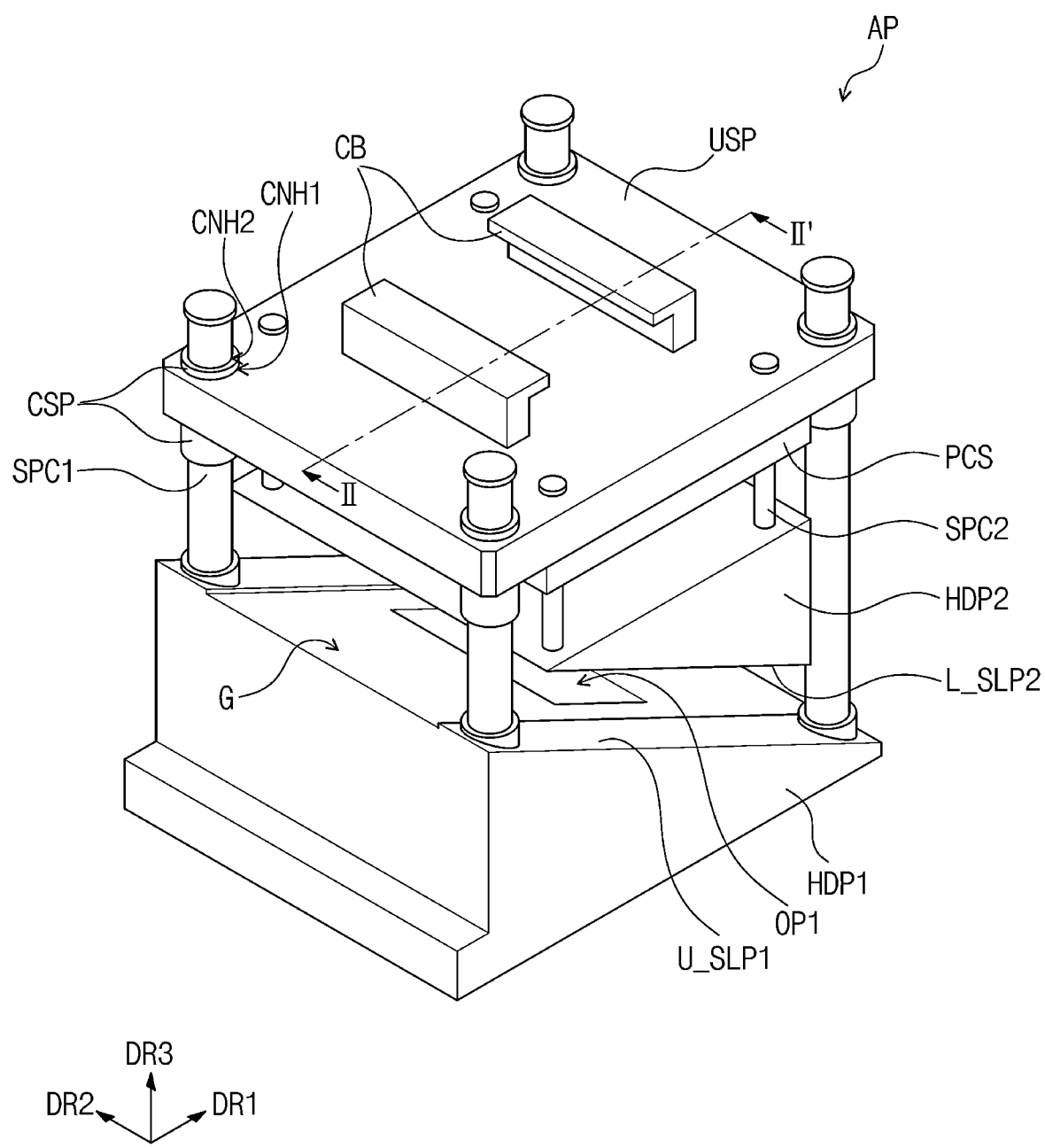
FIG. 11 is a perspective view of an apparatus for manufacturing a chip on film according to an embodiment of the invention.
Figure 12:
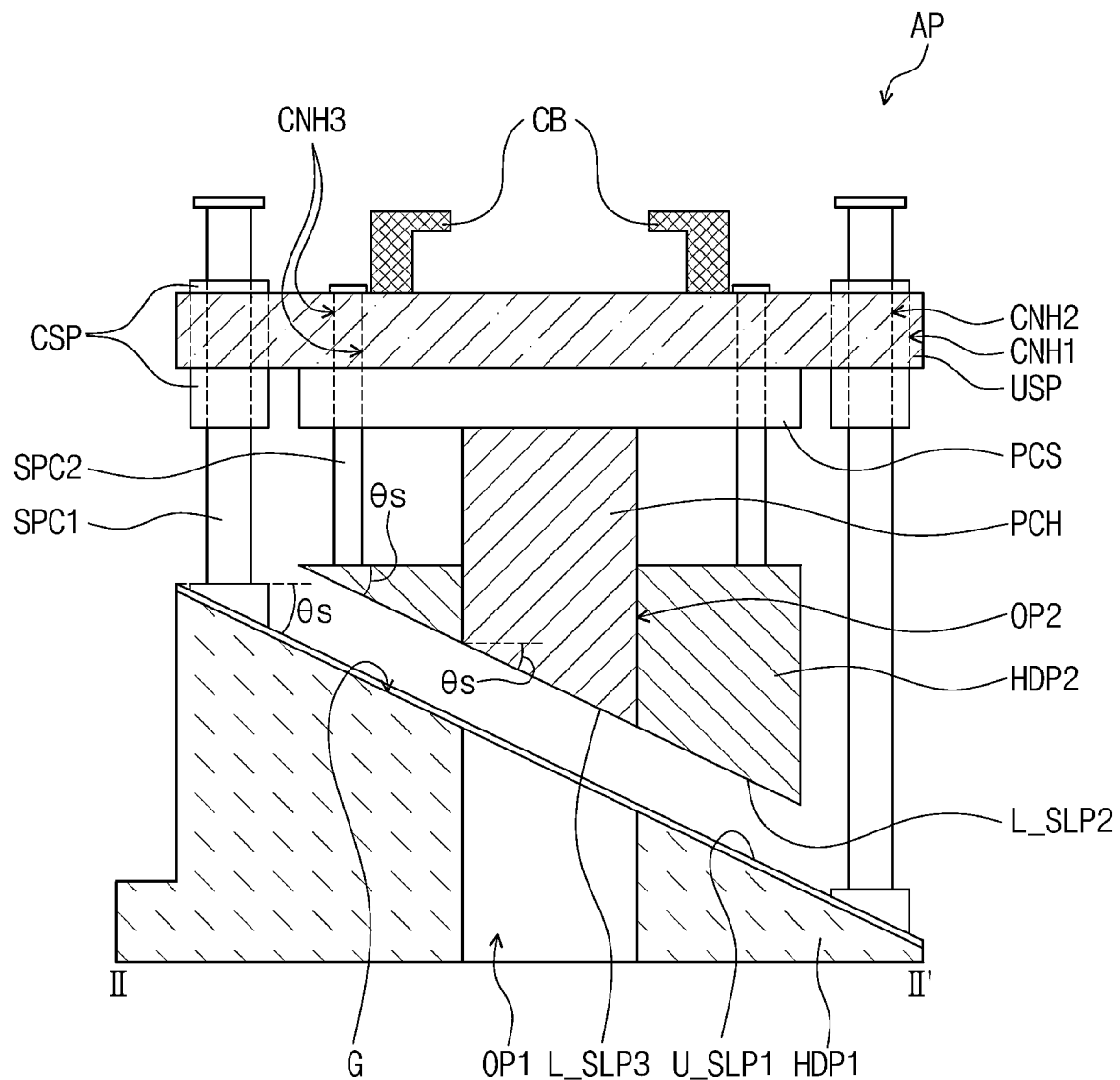
FIG. 12 is a cross-sectional view taken along line II-II' illustrated in FIG. 11.
Figure 12:
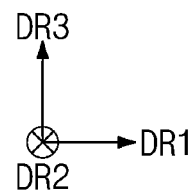
Figure 13:
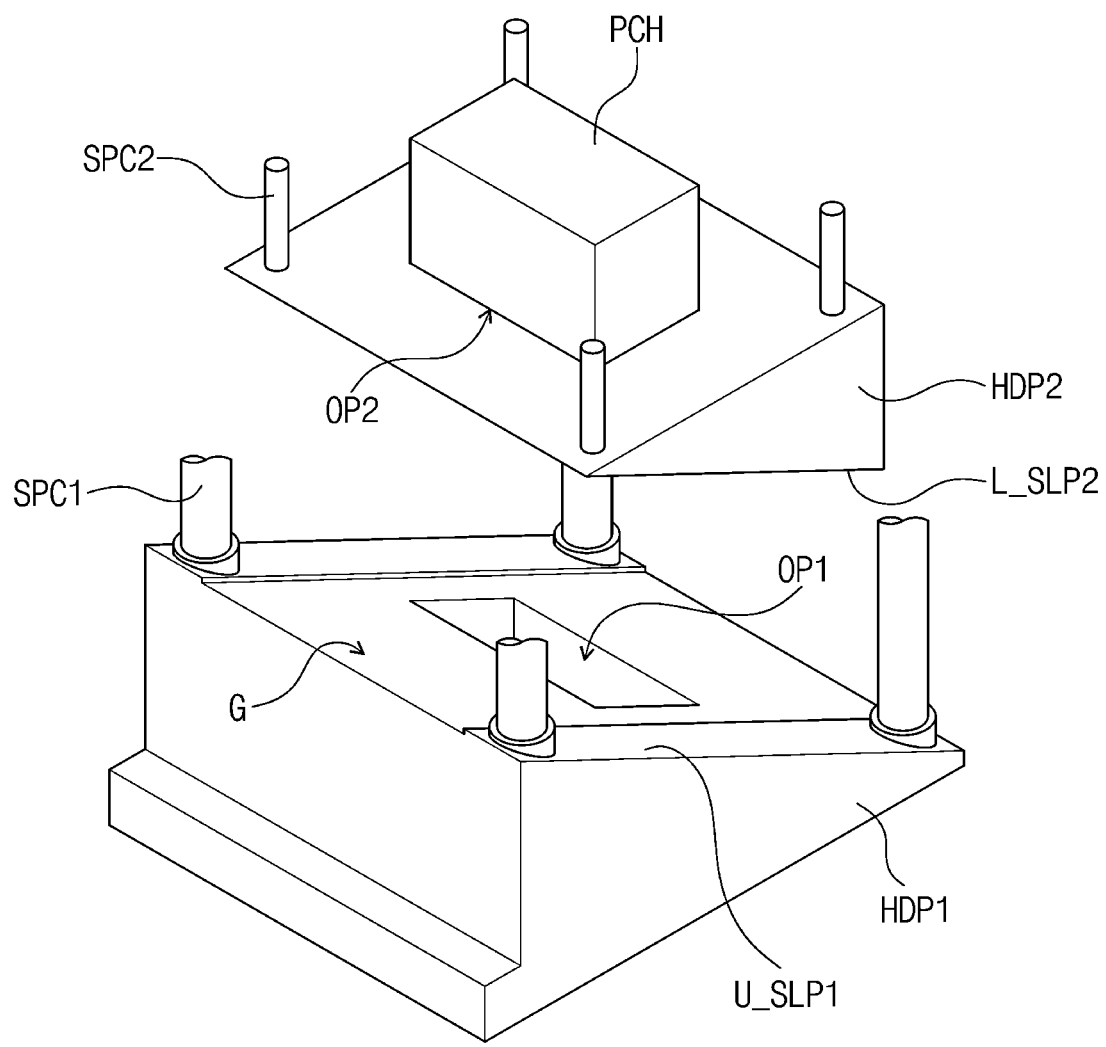
FIG. 13 is a perspective view of a second holder part and a punching part, which are illustrated in FIG. 12.
Figure 14:
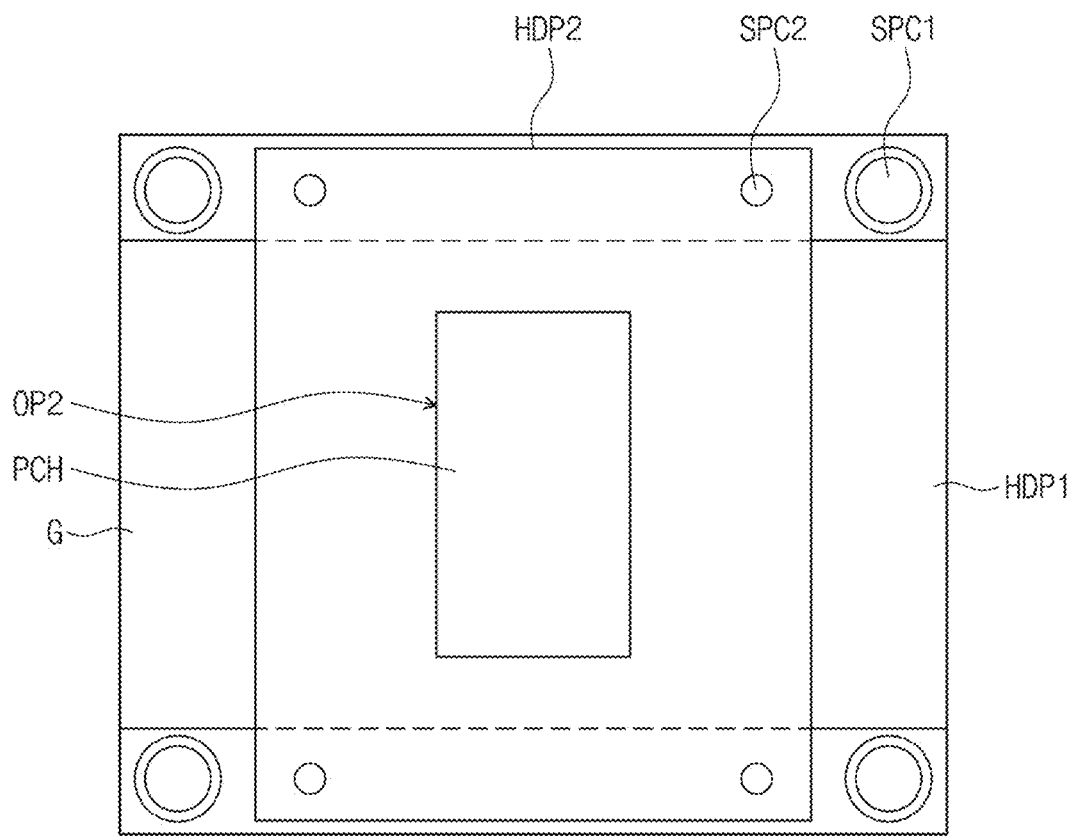
FIG. 14 is a view illustrating a planar configuration of a first holder part, the second holder part, and the punching part, which are illustrated in FIG. 12.
Figure 14:
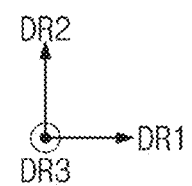

FIG. 11 is a perspective view of an apparatus for manufacturing a chip on film according to an embodiment of the invention. FIG. 12 is a cross-sectional view taken along line II-II' illustrated in FIG. 11. FIG. 13 is a perspective view of a second holder part and a punching part, which are illustrated in FIG. 12. FIG. 14 is a view illustrating a planar configuration of a first holder part, the second holder part, and the punching part, which are illustrated in FIG. 12.

For convenience of illustration and description, in FIG. 13, a second holder part HDP2 and a punching part PCH are further spaced vertically from each other when compared to the structure illustrated in FIG. 12. Also, in FIGS. 14 and 16, a top surface of the first holder part HDP1 is illustrated, and a stepped plane on one side of the first holder part HDP1 is not illustrated.

Referring to FIGS. 11 and 12, an embodiment of an apparatus AP for manufacturing a chip on film may include an upper support plate USP, connection blocks CB, a first holder part HDP1, a plurality of first support pillars SPC1, a plurality of pillar support parts CSP, a second holder part HDP2, a plurality of second support pillars SPC2, a punching part PCH, and a punching support part PCS.

The upper support plate USP may be on a plane defined by the first and second directions DR1 and DR2. The upper support plate USP may have a predetermined thickness in the third direction DR3. When viewed on the plane, the upper support plate USP may have a rectangular shape.

The first holder part HDP1 may be disposed under the upper support plate USP. When viewed on the plane, the first holder part HDP1 may have a rectangular shape. One of both opposing sides of the first holder part HDP1, which is opposite to each other in the first direction DR1, may have a stepped shape. A height of the other side of both the sides of the first holder part HDP1 may be lower than that of one side of the first holder part HDP1. A top surface of the first holder part HDP1 may have an inclined surface U_SLP1 that is angled at a predetermined inclination angle with respect to the first direction DR1.

A first opening OP1 extending downward may be defined in the first holder part HDP1. The first opening OP1 may be defined through the first holder part HDP1 in the third direction DR3. A groove G may be defined in the top surface of the first holder part HDP1. The groove G may extend in the first direction DR1 along the top surface of the first holder part HDP1.

The first support pillars SPC1 may be disposed between the upper support plate USP and the first holder part HDP1. Each of the first support pillars SPC1 may have a cylindrical shape extending in the third direction DR3. Each of the first support pillars SPC1 may be adjacent to a square-shaped vertex of the upper support plate USP and a square-shaped vertex of the first holder part HDP1. In one embodiment, for example, although it four first support pillars SPC1 are disposed, the number of first support pillars SPC1 is not limited thereto.

The first support pillars SPC1 may be connected to the first holder part HDP1 and the upper support plate USP. The upper support plate USP may move vertically along the first support pillars SPC1. Although not shown, a driving part for vertically moving the upper support plate USP may be coupled to the connection blocks CB disposed on the upper support plate USP.

The pillar support parts CSP may be inserted into first connection holes CNH1 defined in the upper support plate USP to be connected to the upper support plate USP. Each of the pillar support parts CSP may have a cylindrical shape extending in the third direction DR3 to extend upward from the top surface of the upper support plate USP and downward from the bottom surface of the upper support plate USP.

The first support pillars SPC1 are inserted into second connection holes CNH2 defined in the pillar support parts CSP to extend upward from the pillar support parts CSP, respectively. The pillar support parts CSP may move vertically along the first support pillars SPC1 together with the upper support plate USP.

The second holder part HDP2 may be disposed on the first holder part HDP1 and may be spaced upward from the first holder part HDP1. The second holder part HDP2 may overlap the first holder part HDP1 around the first opening OP1. The bottom surface of the second holder part HDP2 may have an inclined surface L_SLP2 that is angled at a predetermined inclination angle with respect to the first direction DR1.

The punching support part PCS may be disposed between the upper support plate USP and the second holder part HDP2. The punching support part PCS may be connected to a lower portion of the upper support plate USP. The punching support part PCS may be disposed between the first support pillars SPC1.

The punching part PCH may be disposed on the first holder part HDP1 to be connected to the lower portion of the punching support part PCS and may extend in the third direction DR3. The punching part PCH may overlap the first opening OP1.

A second opening OP2 extending downward may be defined in the second holder part HDP2. The second opening OP2 may be defined through the second holder part HDP2 in the third direction DR3. The second opening OP2 may overlap the first opening OP1. A lower portion of the punching part PCH may be disposed in the second opening OP2. A bottom surface of the punching part PCH may have an inclined surface L_SLP3 that is angled at a predetermined inclination angle with respect to the first direction DR1.

The second support pillars SPC2 may be connected to the second holder part HDP2 to extend in the third direction DR3. The second support pillars SPC2 may be connected to the punching support part PCS and the upper support plate USP. The second support pillars SPC2 may be inserted into third connection holes CNH3 defined in the punching support part PCS and the upper support plate USP.

The punching part PCH, the punching support part PCS, and the second holder part HDP2 may move vertically together with the upper support plate USP. The upper support plate USP and the punching support part PCS may move vertically along the second support pillars SPC2.

The inclined surfaces U_SLP1, L_SLP2, and L_SLP3 may have the same inclination angle with respect to the first direction DR1. An inclination angle $\theta$s defined between each of the inclined surfaces U_SLP1, L_SLP2, and L_SLP3 and the first direction DR1 may be in a range of about 10 degrees to about 60 degrees.

Referring to FIGS. 12 and 13, each of the second support pillars SPC2 may have a cylindrical shape extending in the third direction DR3, and the punching part PCH may be disposed between the second support pillars SPC2. When viewed on the plane, the punching part PCH may have a rectangular shape. In one embodiment, for example, when viewed on the plane, the punching part PCH may have a rectangular shape having short sides in the first direction DR1 and long sides in the second direction DR2. Each of the first opening OP1 and the second opening OP2 may have a rectangular shape corresponding to the punching part PCH.

Referring to FIG. 14, the groove G may be defined between the first support pillars SPC1 arranged in the second direction DR2 to extend in the first direction DR1. A length of the second holder part HDP2 may be greater than that of the groove G based on the second direction DR2.

FIGS. 15 to 20 are views for explaining an embodiment of a method for manufacturing a chip on film using the apparatus for manufacturing the chip on film illustrated in FIG. 11.

Figure 15:
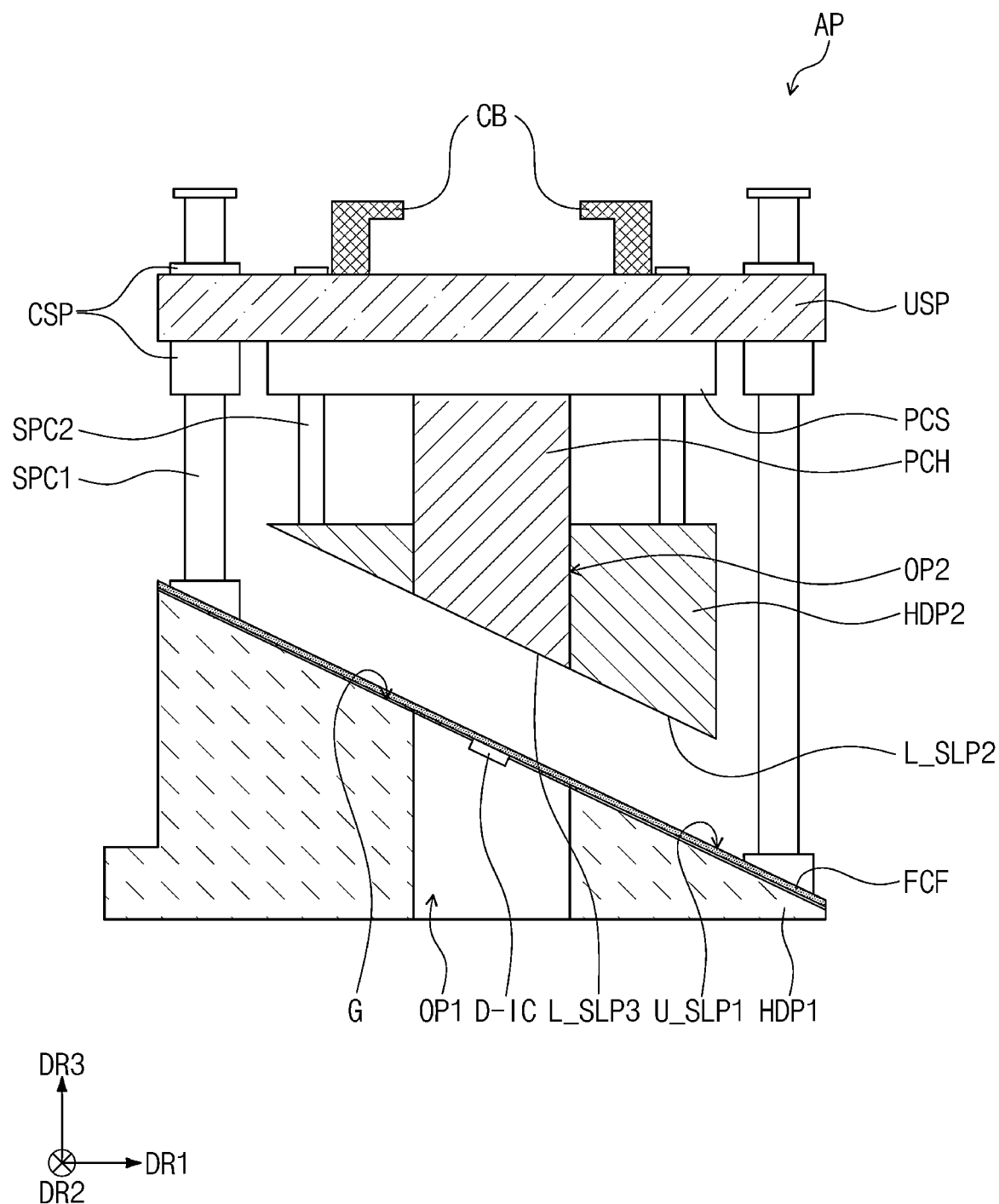
FIGS. 15 to 20 are views for explaining an embodiment of a method for manufacturing a chip on film using the apparatus for manufacturing the chip on film illustrated in FIG. 11.
Figure 17:
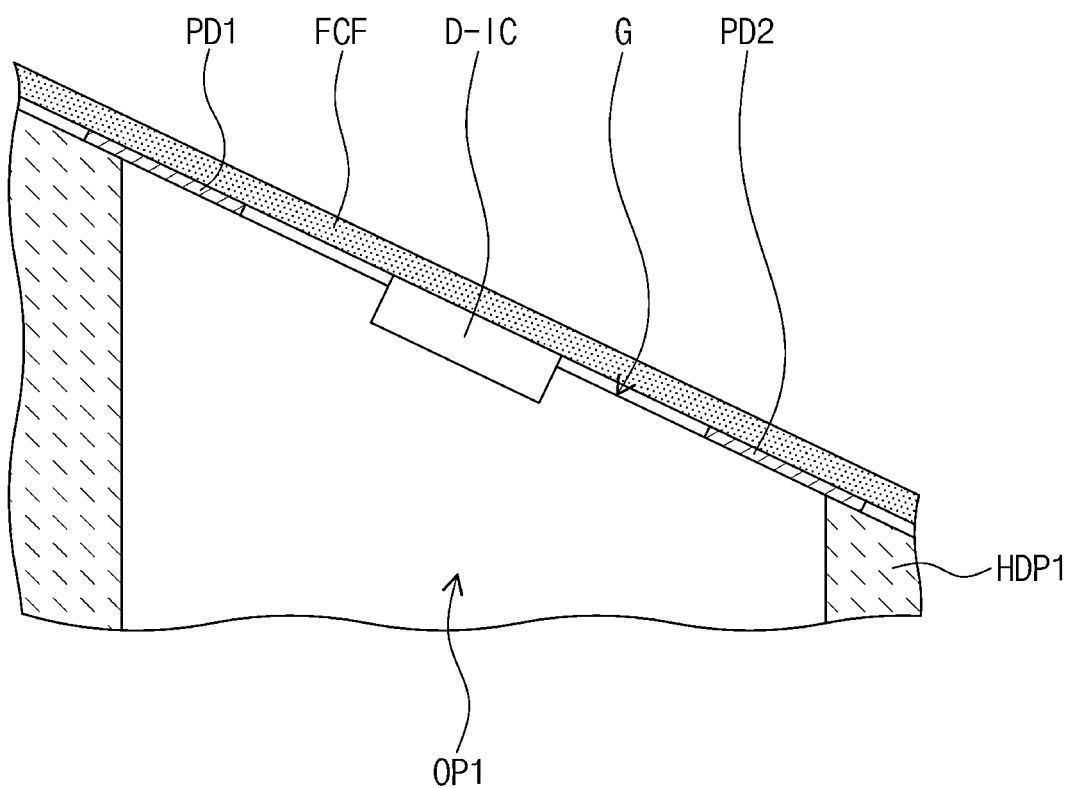
Figure 18:
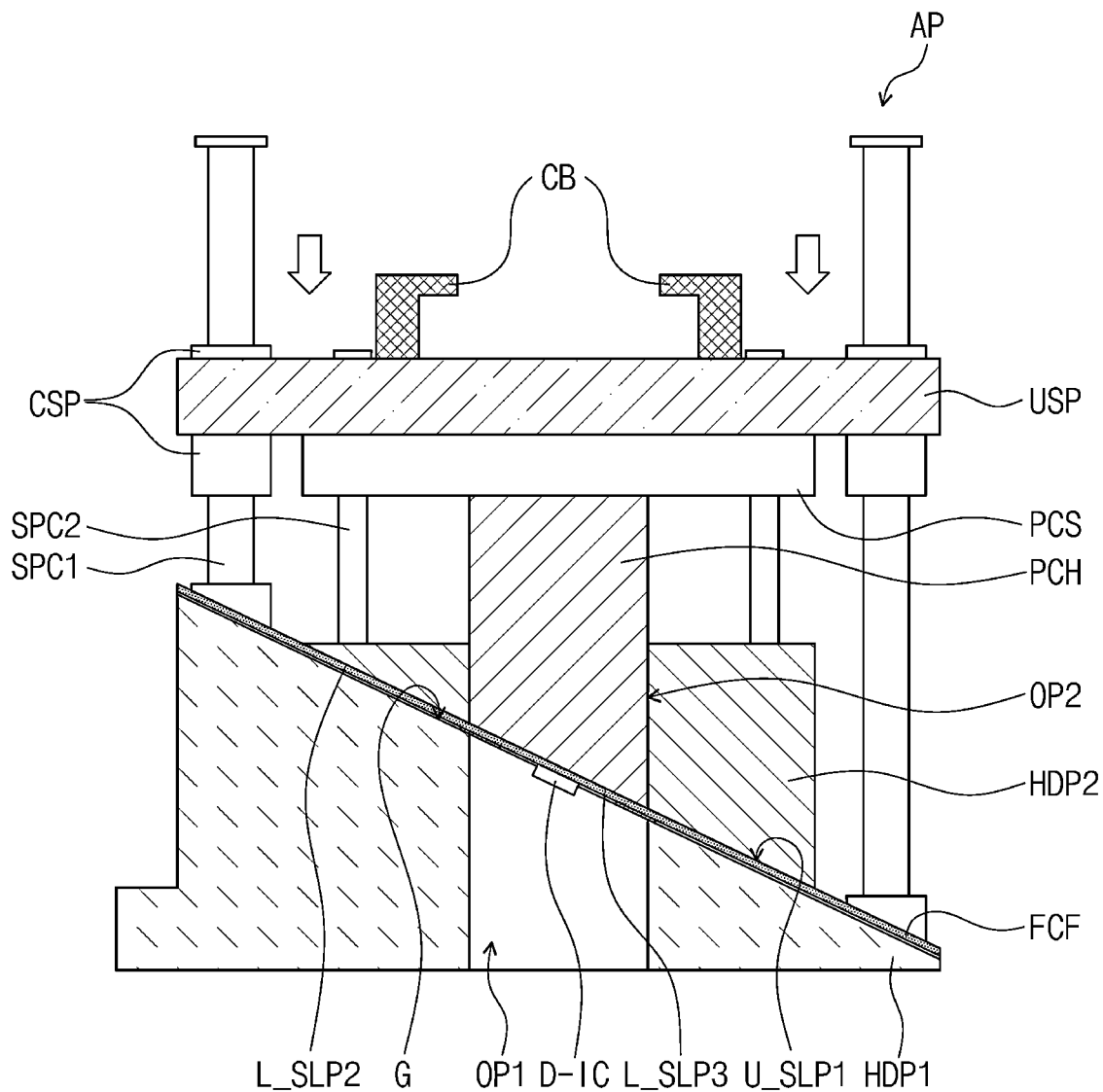
Figure 19:
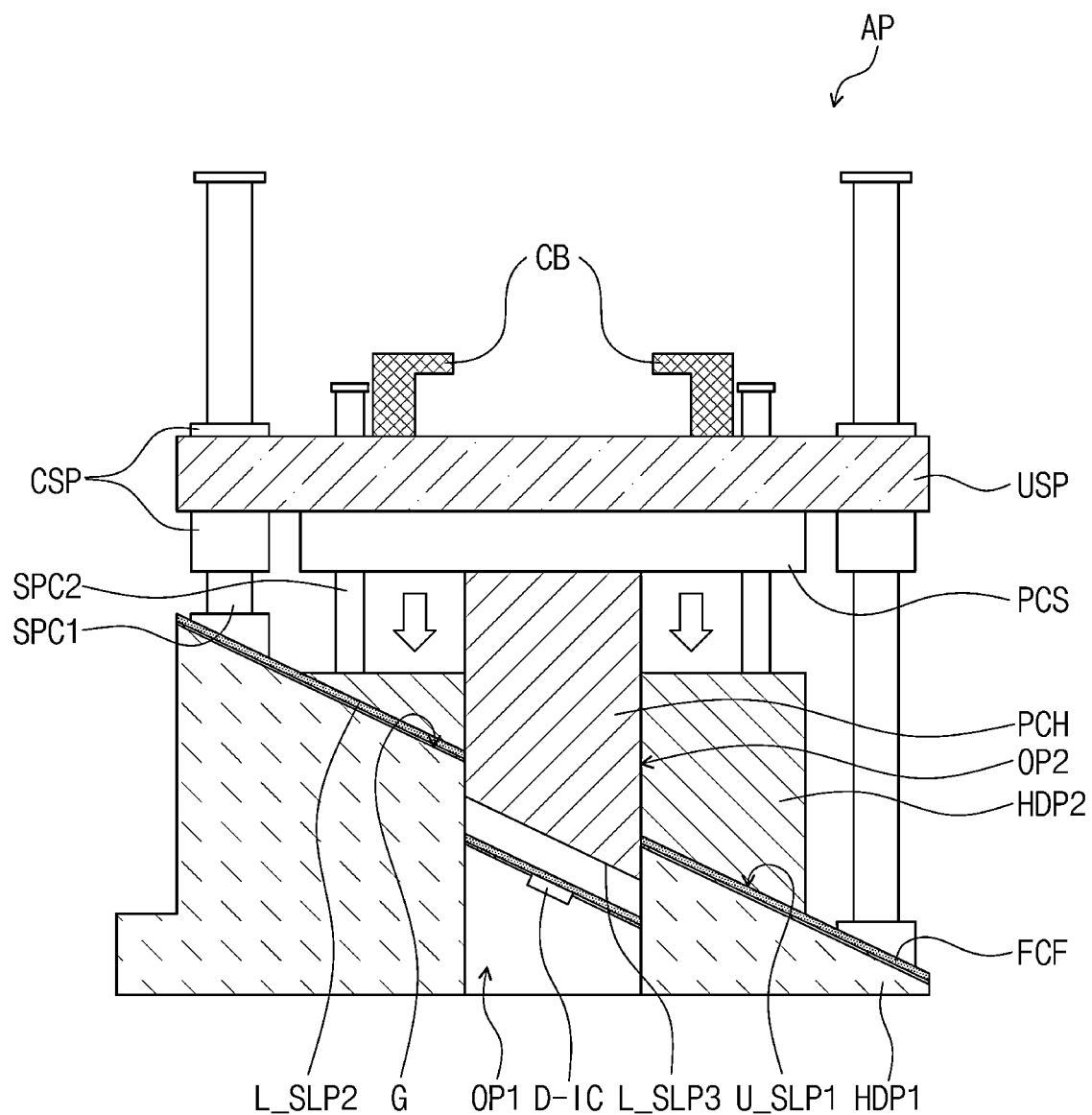
Figure 20:
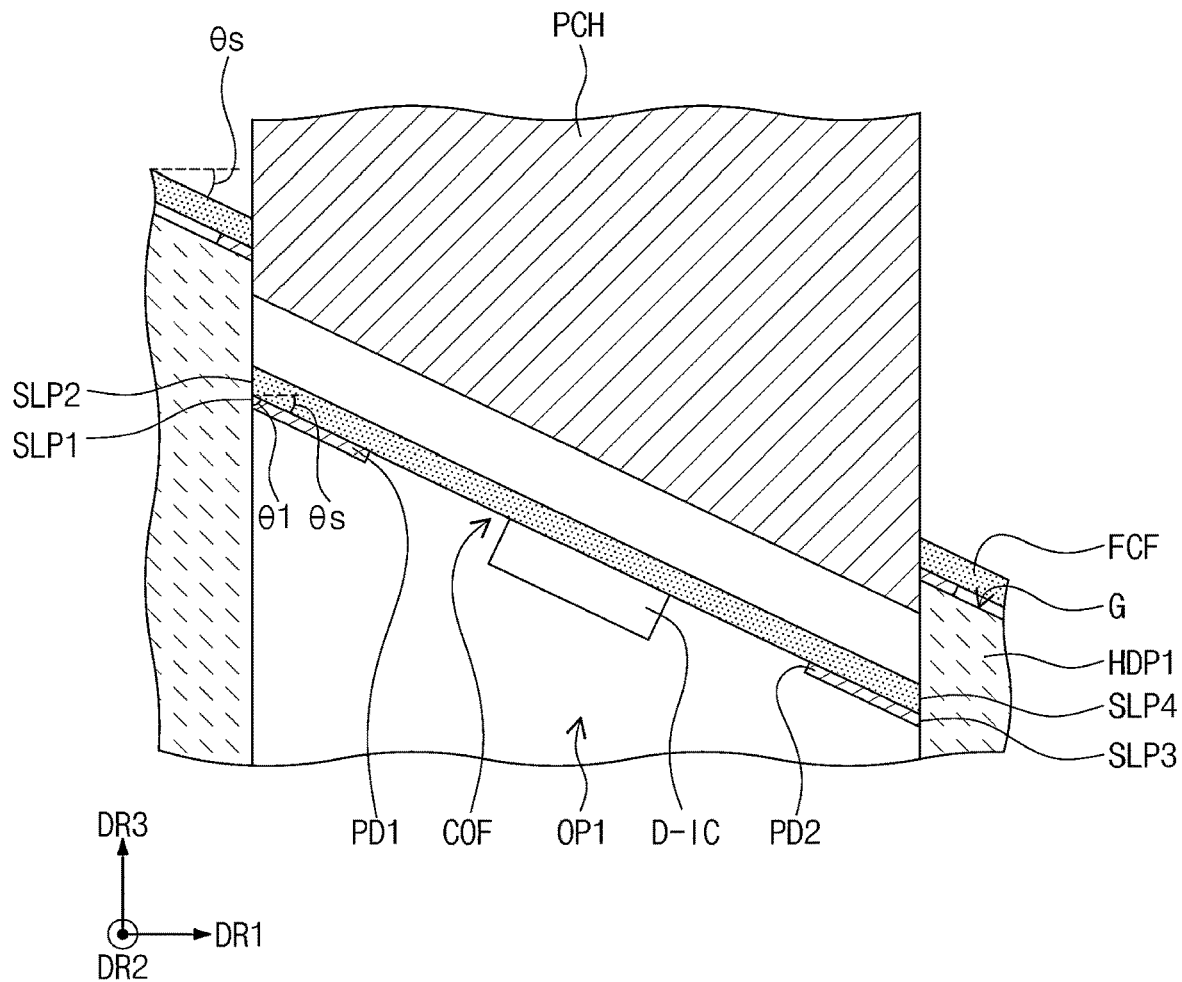

For convenience of illustration and description, FIGS. 15, 18, and 19 illustrate cross-sections corresponding to FIG. 12, and the first, second, and third connection holes CNH1, CNH2, CNH3 are not illustrated in FIGS. 15, 18, and 19. FIGS. 17 and 20 are enlarged views of a flexible circuit film FCF overlapping the first opening OP1 illustrated in FIGS. 15 and 19. For convenience of illustration, reference numerals of the first and second pads PD1 and PD2 are omitted in FIGS. 15, 18, and 19.

Figure 16:
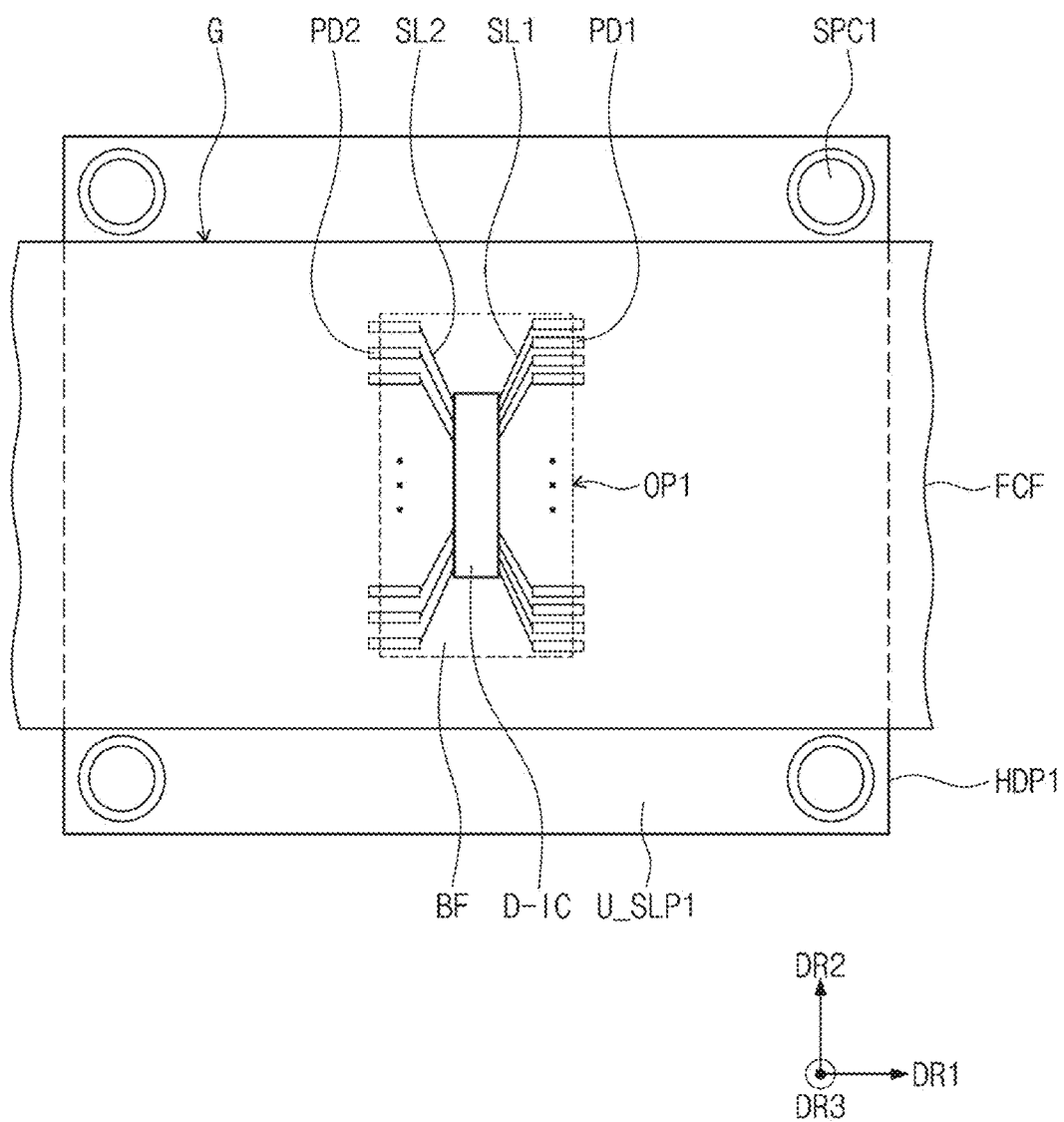

Referring to FIGS. 15 and 16, the flexible circuit film FCF may be disposed on the top surface of the first holder part HDP1. In such an embodiment, the flexible circuit film FCF may be disposed in the groove G defined on the top surface of the first holder part HDP1 to extend in the first direction DR1. The second holder part HDP2 and the punching part PCH may be disposed on the flexible circuit film FCF.

The flexible circuit film FCF may include a base film BF, a driving chip D-IC disposed under the base film BF, first pads PD1 disposed under the base film BF and connected to the driving chip D-IC, and second pads PD2 disposed under the base film BF and connected to the driving chip D-IC.

The driving chip D-IC, portions of the first pads PD1, and portions of the second pads PD2 may be disposed to overlap the first opening OP1. Thus, the first opening OP1 may expose the driving chip D-IC, the portions of the first pads PD1, and the portions of the second pads PD2.

Referring to FIG. 17, the first pad PD1 may be spaced apart from the driving chip D-IC in the first direction DR1, and a top surface of the first pad PD1 may be disposed higher than a top surface of the driving chip D-IC. A top surface of the second pad PD2 may be disposed lower than the top surface of the driving chip D-IC. The top surface of the driving chip D-IC and the top surface of the second pad PD2 may face the base film BF.

Referring to FIG. 18, the upper support plate USP and the pillar support parts CSP may move downward along the first support pillars SPC1. Also, the punching support part PCS, the punching part PCH, the second holder part HDP2, and the second support pillars SPC2 may move downward together with the upper support plate USP.

The second holder part HDP2 may move downward to fix the flexible circuit film FCF around the first opening OP1. In such an embodiment, the inclined surface L_SLP2 of the bottom surface of the second holder part HDP2 may be in contact with the top surface of the base film BF around the first opening OP1 to fix the base film BF.

Referring to FIG. 19, the upper support plate USP and the pillar support parts CSP may move downward along the first support pillars SPC1. Also, the punching support part PCS and the punching part PCH may move downward together with the upper support plate USP. The upper support plate USP and the punching support part PCS may move downward along the second support pillars SPC2.

The punching part PCH may move downward and be inserted into the first opening OP1. The flexible circuit film FCF may be cut along an edge of the punching part PCH. The cut flexible circuit film FCF may fall through the first opening OP1 and may be collected by a manufacturer.

Referring to FIG. 20, a cut portion of the flexible circuit film FCF may be formed as the chip on film COF. Since each of the top surface of the first holder part HDP1, the bottom surface of the second holder part HDP2, and the bottom surface of the punching part PCH has the inclined surface, the flexible circuit film FCF may be disposed to be inclined.

In this case, when the flexible circuit film FCF is cut, the first angle θ1 formed between the first inclined surface SLP1 of the first pad PD1 and the top surface of the first pad PD1 may be determined as a value obtained by subtracting the first angle θs from 90 degrees. The first angle θ1 formed between the second inclined surface SLP2 of the base film BF and the top surface of the base film BF may also be determined as a value obtained by subtracting the inclination angle θs from 90 degrees. Also, the third inclined surface SLP3 and the fourth inclined surface SLP4 may have reverse inclined surfaces with respect to the first inclined surface SLP1 and the second inclined surface SLP2, respectively.

Figure 21:
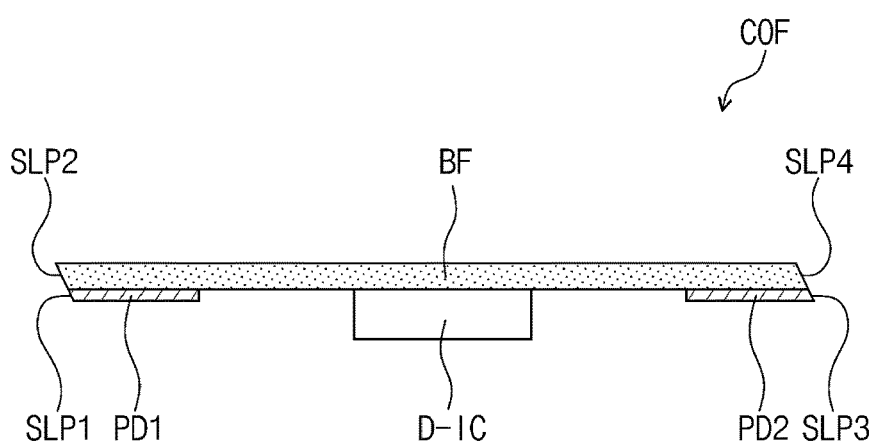
FIG. 21 is a cross-sectional view of an embodiment of the chip on film manufactured by the method for manufacturing the chip on film illustrated in FIG. 20.

FIG. 21 is a cross-sectional view of an embodiment of the chip on film manufactured by the method for manufacturing the chip on film illustrated in FIG. 20.

Referring to FIG. 21, a portion of the flexible circuit film FCF cut in FIG. 19 may be disposed horizontally, and thus, the chip on film COF illustrated in FIG. 5 may be manufactured. As a result, one side of the first pad PD1 of the chip on film COF may have the first inclined surface SLP1.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

INDUSTRIAL APPLICABILITY

The structure in which the pads are connected by the ultrasonic bonding manner without using the anisotropic conductive film to prevent the short-circuit from occurring may be a technique that is capable of improving the yield of the display device, and thus, embodiments of the invention have high industrial applicability.

The invention claimed is:

1. A display device comprising:
   a base film;
   a driving chip disposed under the base film;
   a first pad disposed under the base film and connected to the driving chip; and
   a display panel comprising a first connection pad connected to the first pad,
   wherein one side of the first pad has a first inclined surface which is angled at a first angle with respect to a top surface of the first pad,
   the top surface of the first pad faces the base film,
   a bottom surface of the first pad faces the first connection pad, and
   the first angle is an acute angle.

2. The display device of claim 1, wherein the one side of the first pad is adjacent to one side of the base film connected to the display panel.

3. The display device of claim 2, wherein the one side of the base film has a second inclined surface which is angled at the first angle with respect to a top surface of the base film.

4. The display device of claim 3, wherein the first inclined surface and the second inclined surface are disposed on a same plane as each other.

5. The display device of claim 2, wherein
the first pad extends in a first direction crossing an extension direction of the one side of the base film, and
the first angle is in a range of about 30 degrees to about 80 degrees with respect to the first direction.

6. The display device of claim 5, wherein
the first pad is provided in plural, and
the plurality of first pads are arranged along the one side of the base film by extending in the first direction.

7. The display device of claim 5, wherein the first pad comprises:
a first portion on which the first inclined surface is defined; and
a second portion around the first portion.

8. The display device of claim 7, wherein
the first portion is spaced apart from the first connection pad, and
the second portion is in contact with the first connection pad.

9. The display device of claim 7, wherein, the first portion has a length in the first direction less than or equal to ½ of a length of the first pad in the first direction.

10. The display device of claim 2, further comprising:
a second pad disposed under the base film and connected to the driving chip,
wherein one side of the second pad is adjacent to the other side of the base film, which is opposite to the one side of the base film,
the one side of the second pad has a third inclined surface which is angled at a second angle with respect to a top surface of the second pad, and
the second angle is a value obtained by subtracting the first angle from 180 degrees.

11. The display device of claim 10, wherein the other side of the base film has a fourth inclined surface which is angled at the second angle with respect to a top surface of the base film.

12. The display device of claim 11, wherein the third inclined surface and the fourth inclined surface are disposed on a same plane as each other.

13. The display device of claim 1, further comprising:
a resin disposed on both opposing sides of the first pad and on both opposing sides of the first connection pad.

14. A display device comprising:
a base film;
a driving chip disposed under the base film;
a first pad disposed under the base film and connected to the driving chip; and
a display panel comprising a first connection pad which overlaps the first pad and is connected to the first pad when viewed on a plane,
wherein an upper surface of the first connection pad faces the first pad, and
a portion of the upper surface of the first connection pad is not in contact with the first pad and overlaps the first pad in a thickness direction of the first connection pad.

15. The display device of claim 14, wherein the first pad comprises a first portion which is in contact with the first connection pad.

16. The display device of claim 15, wherein the first pad further comprises a second portion which is not in contact with the first connection pad.

* * * * *